(12) United States Patent
Suehiro et al.

(10) Patent No.: US 8,172,443 B2
(45) Date of Patent: May 8, 2012

(54) LIGHT SOURCE UNIT

(75) Inventors: Yoshinobu Suehiro, Aichi-ken (JP);
Koji Tasumi, Aichi-ken (JP); Kazue Tagata, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 106 days.

(21) Appl. No.: 12/385,167

(22) Filed: Mar. 31, 2009

(65) Prior Publication Data
US 2009/0262517 A1    Oct. 22, 2009

(30) Foreign Application Priority Data
Apr. 3, 2008   (JP) ................................. 2008-097340

(51) Int. Cl.
*F21V 5/00* (2006.01)
(52) U.S. Cl. ..................... 362/558; 362/249.02; 362/245
(58) Field of Classification Search .................. 362/152,
362/242–246, 249.01, 249.02, 326, 327,
362/331, 332, 544, 545, 554–556, 558, 800,
362/804; 257/81, 98–100, 33.002; 313/498,
313/500, 512; 385/15, 34, 39, 42, 50, 51,
385/140, 141, 142, 901
See application file for complete search history.

(56) References Cited

U.S. PATENT DOCUMENTS

| | | | | |
|---|---|---|---|---|
| 4,466,697 A * | 8/1984 | Daniel | .......................... | 385/123 |
| 6,550,952 B1 * | 4/2003 | Hulse et al. | ................... | 362/555 |
| 6,744,194 B2 * | 6/2004 | Fukasawa et al. | ........... | 313/486 |
| 6,819,505 B1 * | 11/2004 | Cassarly et al. | .............. | 359/726 |
| 7,218,824 B2 * | 5/2007 | Franklin et al. | ............... | 385/125 |
| 7,401,948 B2 * | 7/2008 | Chinniah et al. | .............. | 362/326 |
| 7,506,998 B2 * | 3/2009 | Ansems et al. | ................ | 362/245 |
| 7,514,722 B2 * | 4/2009 | Kawaguchi et al. | ........... | 257/98 |
| 7,658,528 B2 * | 2/2010 | Hoelen et al. | ................. | 362/555 |
| 7,740,177 B2 * | 6/2010 | Weiser | ..................... | 235/462.49 |
| 2003/0076034 A1 * | 4/2003 | Marshall et al. | .............. | 313/512 |
| 2004/0046178 A1 * | 3/2004 | Sano | .............................. | 257/98 |
| 2004/0264185 A1 * | 12/2004 | Grotsch et al. | ................ | 362/231 |

(Continued)

FOREIGN PATENT DOCUMENTS

| | | |
|---|---|---|
| JP | 2005-064145 | 3/2005 |
| JP | 2005-158963 | 6/2005 |

*Primary Examiner* — Hargobind S Sawhney
(74) *Attorney, Agent, or Firm* — McGinn IP Law Group, PLLC

(57) ABSTRACT

A light source unit includes a light source portion including a mounting board, a light emitting element mounted on the mounting board, a rectangular solid sealing material for sealing the light emitting element, the sealing material including a first distance between the light emitting element and a top face thereof and a second distance between the light emitting element and a side face thereof, the first distance being greater than the second distance and a phosphor dispersed in the sealing material for radiating a wavelength conversion light by being excited by light emitted from the light emitting element, wherein a first light emitted through the top face of the sealing material is different in emission color from a second light emitted through the side face of the sealing material. The light source unit further includes an optical connection member including a reflection surface for reflecting light emitted from the side face of the sealing material, and a light guiding member including an end face through which light emitted through the top face of the sealing material and light reflected by the reflection surface of the optical connection member are inputted into the light guiding member.

21 Claims, 29 Drawing Sheets

U.S. PATENT DOCUMENTS

| | | | |
|---|---|---|---|
| 2005/0211991 A1* | 9/2005 | Mori et al. | 257/79 |
| 2007/0031089 A1* | 2/2007 | Tessnow et al. | 385/49 |
| 2008/0032142 A1* | 2/2008 | Tasumi et al. | 428/447 |
| 2008/0036362 A1* | 2/2008 | Tanimoto et al. | 313/498 |
| 2008/0074029 A1* | 3/2008 | Suehiro | 313/487 |
| 2008/0192153 A1* | 8/2008 | Kuhn et al. | 348/759 |

* cited by examiner

LIGHT SOURCE UNIT

The present application is based on Japanese patent application No. 2008-097340 filed on Apr. 3, 2008, the entire contents of which are incorporated herein by reference.

BACKGROUND OF THE INVENTION

1. Field of the Invention

This invention relates to a light source unit composed of a light source portion with a rectangular solid sealing material, and a light guiding member connected through an optical connection member to the light source portion.

2. Description of the Related Art

JP-A-2005-158963 discloses a light source unit that is composed of an LED (light-emitting diode) package with an LED chip mounted thereon, a wiring board as a unit board having a wiring pattern on which the LED package is mounted, a lens disposed over the LED package with its optical axis to be nearly consistent with that of the LED chip, and a wavelength conversion member. In the light source unit of JP-A-2005-158963, the lens is provided with the wavelength conversion member, as a light-emitting portion, which is disposed nearly at the focal position thereof and fixed to the LED package. The wavelength conversion member is disposed over the LED package, and the LED package is provided with a case integrated with a reflector for reflecting light sideward emitted from the LED chip, such that light can be extracted only from upward. JP-A-2005-64145 also discloses a light source unit with an LED package adapted to extract only from upward.

However, the light source units of JP-A-2005-158963 and JP-A-2005-64145 has a problem that the light source unit increases in size since the reflector needs to be integrated with the case. In addition, there is a problem that light sideward emitted from the LED chip is inputted into and absorbed by a chip mounting portion and the reflector of the case as well as the wiring pattern so that light extraction efficiency from the light source portion lowers.

SUMMARY OF THE INVENTION

It is an object of the invention to provide a light source unit that allows downsizing of its light source portion and enhancement in light extraction efficiency from the light source portion.

(1) According to one embodiment of the invention, a light source unit comprises:

a light source portion comprising:

a mounting board;

a light emitting element mounted on the mounting board;

a rectangular solid sealing material for sealing the light emitting element, the sealing material comprising a first distance between the light emitting element and a top face thereof and a second distance between the light emitting element and a side face thereof, the first distance being greater than the second distance; and a phosphor dispersed in the sealing material for radiating a wavelength conversion light by being excited by light emitted from the light emitting element, wherein a first light emitted through the top face of the sealing material is different in emission color from a second light emitted through the side face of the sealing material;

an optical connection member comprising a reflection surface for reflecting light emitted from the side face of the sealing material; and a light guiding member comprising an end face through which light emitted through the top face of the sealing material and light reflected by the reflection surface of the optical connection member are inputted into the light guiding member.

In the above embodiment (1), the following modifications, changes and a combination thereof can be made.

(i) The light guiding member further comprises a light scattering portion for scattering light inputted through the end face.

(ii) The light guiding member is constructed such that light inputted through the end face is multiply reflected inside the light guiding member.

(iii) The optical connection member further comprises a light scattering portion for scattering light inputted through the optical connection member into the light guiding member.

(iv) A relationship: $\sqrt{2} \leq a/b$ is satisfied, where the first distance is a and the second distance is b.

(v) The sealing material comprises glass.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
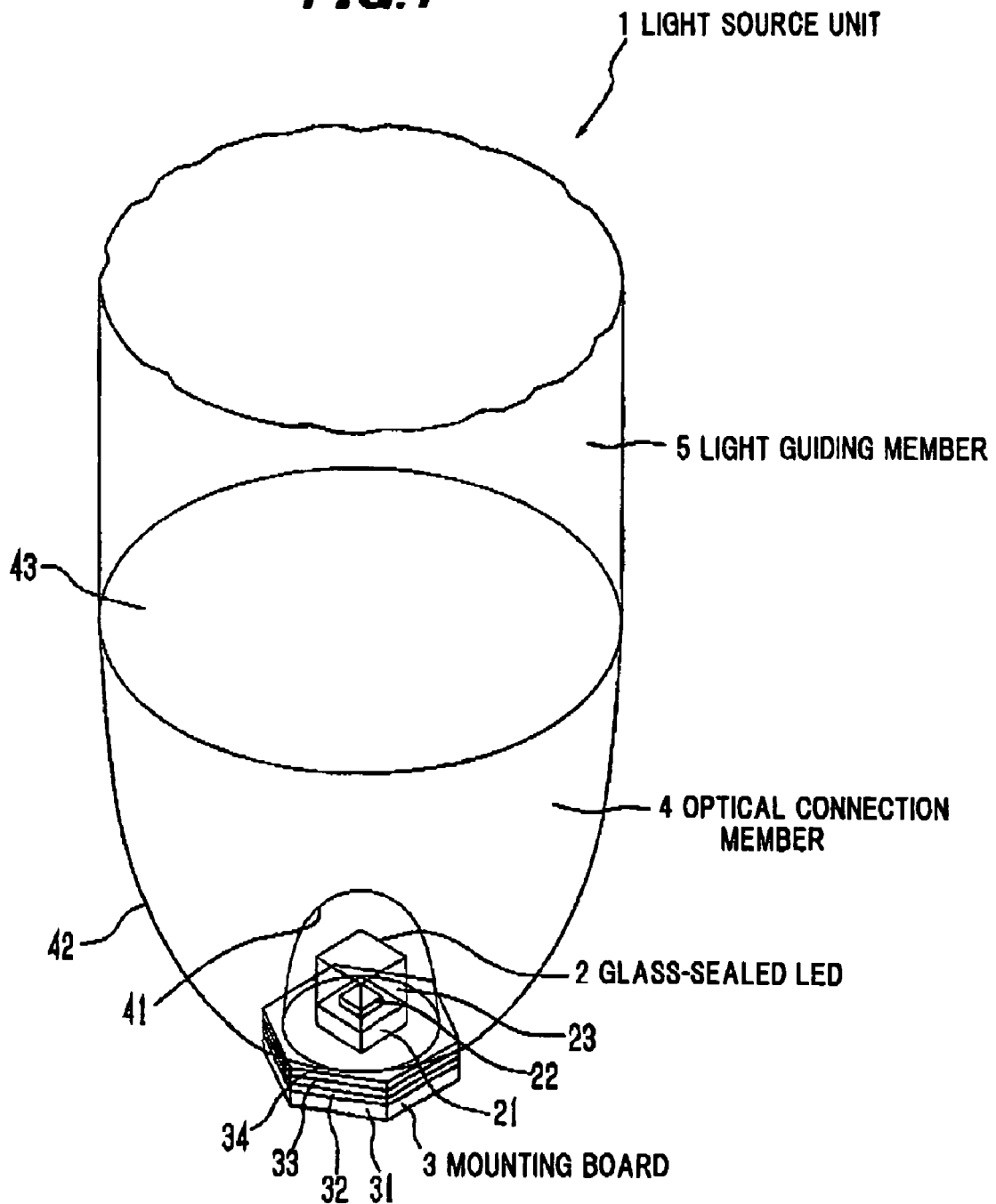
FIG. 1 is a schematic perspective view showing a light source unit in a first preferred embodiment according to the invention.

FIGS. 1 to 6 show a light source unit in the first embodiment of the invention. FIG. 1 is a schematic perspective view showing the light source unit.

As shown in FIG. 1, the light source unit 1 is composed of a glass-sealed LED 2 as a light source portion, a mounting board 3 on which the glass-sealed LED 2 is mounted, an optical connection member 4 into which light emitted from the glass-sealed LED 2 is inputted, and a light guiding member 5 into which light outputted from the optical connection member 4 is then inputted. The light source unit 1 is constructed such that, when the glass-sealed LED 2 emits light, the transparent and cylindrical light guiding member 5 radiates light from its entire body. The glass-sealed LED 2 is formed a rectangular solid which has a dimension in the vertical direction longer than that in the depth and width directions, and stands on the mounting board 3. The mounting board 3 supports the glass-sealed LED 2 and is electrically connected to a power supply (not shown) to supply power to the glass-sealed LED 2. The optical connection member 4 is transparent, surrounds the glass-sealed LED 2 together with the mounting board 3, and is connected to the light guiding member 5.

Figure 2:
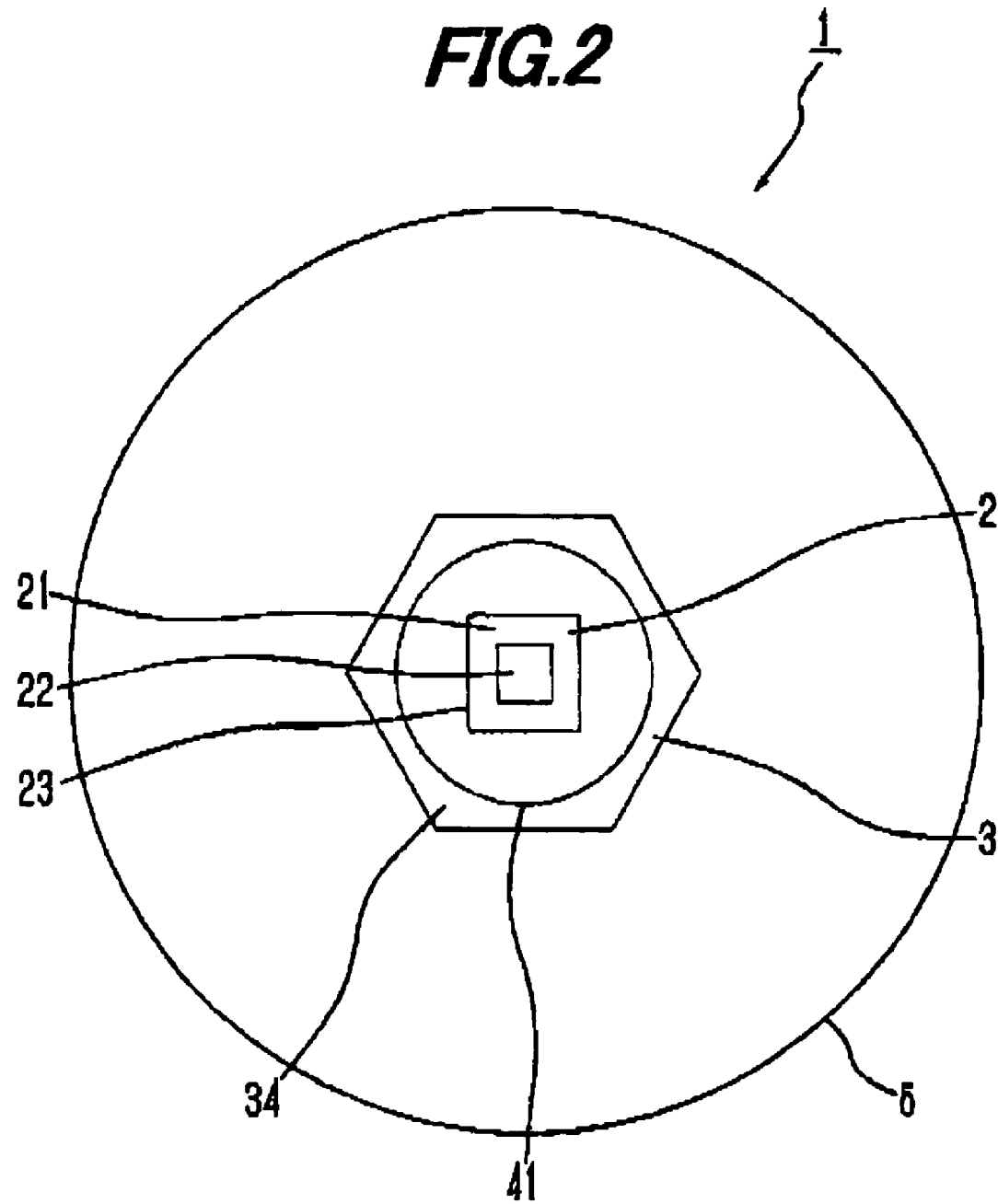
FIG. 2 is a top view showing the light source unit in FIG. 1.

FIG. 2 is a top view showing the light source unit in FIG. 1.

As shown in FIG. 2, the glass-sealed LED 2 is formed a square (in top view), and the mounting board 3 is formed a regular hexagon (in top view). The light guiding member 5 is larger than the glass-sealed LED 2 in top view such that it has an emission area (in top view) greater than the glass-sealed LED 2 as a light source portion.

Figure 3:
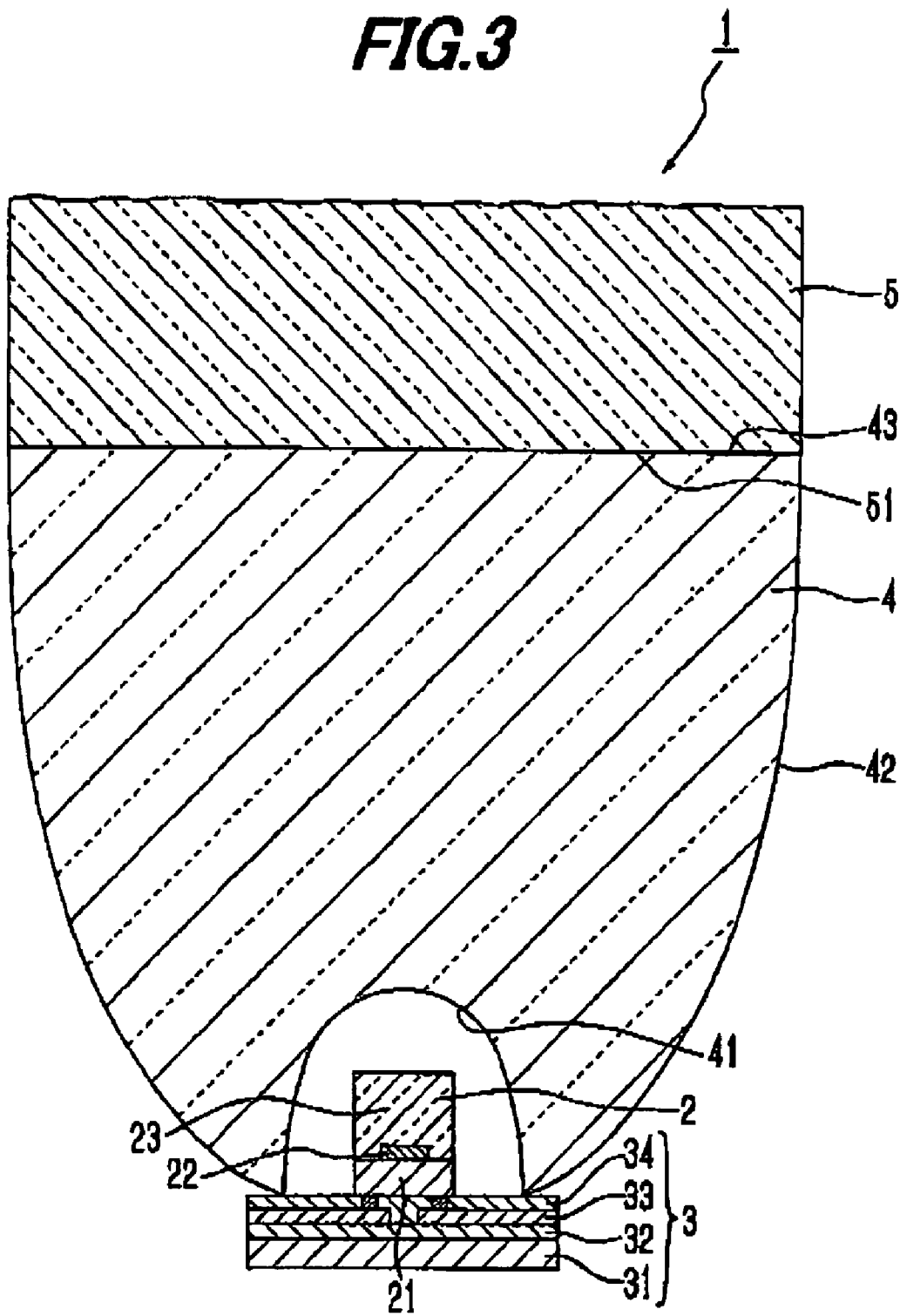
FIG. 3 is a schematic vertical cross sectional view showing the light source unit in FIG. 1.

FIG. 3 is a schematic vertical cross sectional view showing the light source unit in FIG. 1.

As shown in FIG. 3, the mounting board 3 is composed of, formed in the following order from the bottom side, a metal base portion 31, an insulation layer 32, a circuit pattern layer 33 and a white resist layer 34. The metal base portion 31 is of, e.g., aluminum, provides the mounting board 3 with rigidity, and serves to dissipate heat generated from the glass-sealed LED 2. The insulation layer 32 is of, e.g., polyamide resin, epoxy resin etc., and serves to insulate the conductive metal base portion 31 from the circuit pattern layer 33. The circuit pattern layer 33 is of, e.g., copper with a gold film formed on the surface (upper surface) thereof, and electrically connected to the glass-sealed LED 2. The white resist layer 34 is of, e.g., epoxy resin with titanium oxide fillers mixed therein, and serves to increase the reflectivity of the top surface of the mounting board 3.

The optical connection member 4 is of transparent resin such as acrylic resin, contacts the mounting board 3 and the light guiding member 5, respectively, and is formed such that it expands from the mounting board 3 side to the light guiding member 5 side. On the mounting board 3 side, the optical connection member 4 is provided with a recess (or concave portion) for enclosing the glass-sealed LED 2 protruding from the mounting board 3. The optical connection member 4 is composed of an incidence surface 41 which forms the surface of the recess and into which a part of light from the glass-sealed LED 2 is inputted, a reflection surface 42 which forms the side face of the optical connection member 4 and on which a part of light inputted into the incidence surface 41 is reflected, and an output surface 43 which forms the top surface of the optical connection member 4 and through which light inputted into the optical connection member 4 is outputted to the light guiding member 5.

The incidence surface 41 is formed such that it allows light emitted from the glass-sealed LED 2 to be inputted nearly perpendicularly to the optical connection member 4, and is formed nearly a hemisphere with the glass-sealed LED 2 at the center thereof. Therefore, light emitted from the glass-sealed LED 2 can be little refracted by the incidence surface 41 when being inputted into the optical connection member 4. The glass-sealed LED 2 is enclosed by the incidence surface 41 and the top surface of the mounting board 3.

The reflection surface 42 is formed nearly a paraboloidal surface with a LED element 22 of the glass-sealed LED 2 located at a focal point thereof, and reflects light emitted from the glass-sealed LED 2 in the direction nearly perpendicular to the mounting board 3. Here, the reflection surface 42 is not limited to the paraboloidal surface and may be, e.g., an elliptical surface. The reflection surface 42 reflects the side face of the glass-sealed LED 2 when viewed from the light guiding member 5, so that it mainly reflects light emitted from the glass-sealed LED 2. The top end of the reflection surface 42 is flush with the outside surface (side face) of the light guiding member 5. The output surface 43 is parallel to the mounting board 3, and in close contact with an incidence surface 51 as an end face of the light guiding member 5. The incidence surface 51 of the light guiding member 5 is parallel to the top surface of a glass seal portion 23 of the glass-sealed LED 2, so that light emitted through the top surface of the glass-sealed LED 2 and light reflected on the reflection surface 42 are inputted therethrough. The light guiding member 5 is sufficiently elongated such that light inputted through the end face (i.e., the incidence surface 51) on the side of the glass-sealed LED 2 can be multiply reflected inside the light guiding member 5.

Figure 4:
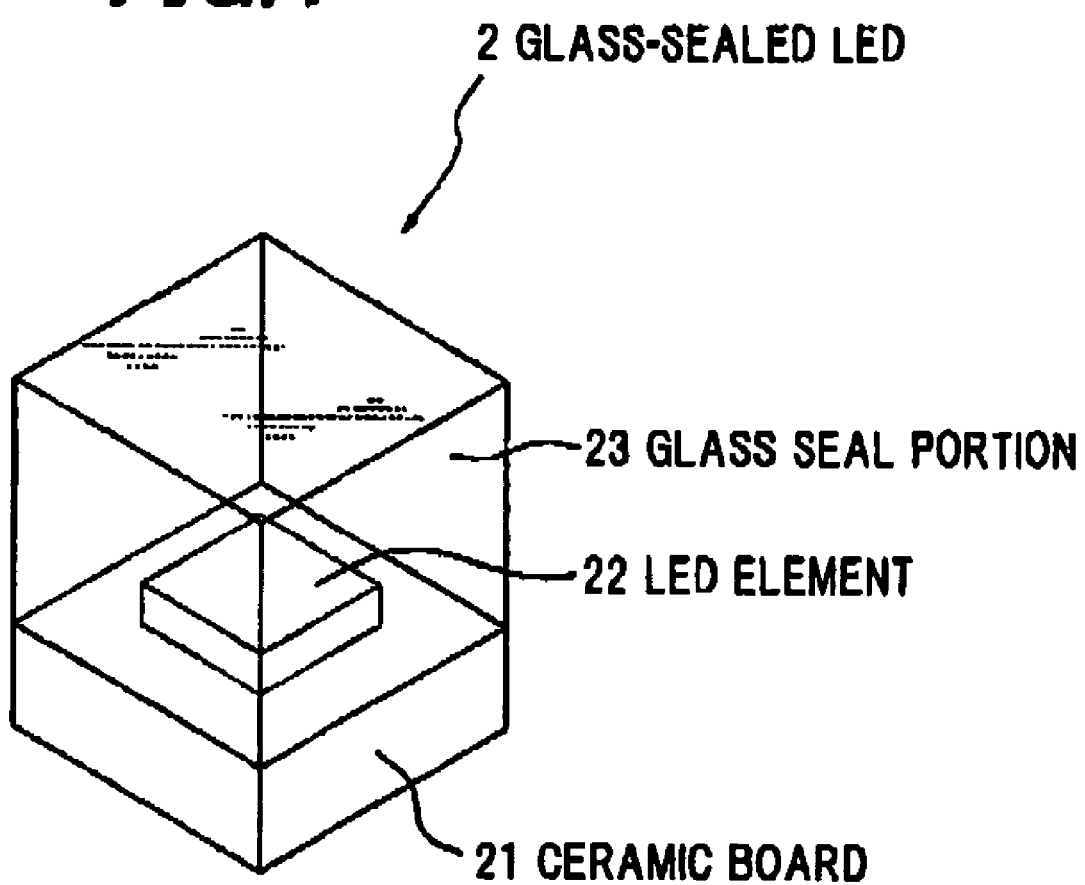
FIG. 4 is a schematic perspective view showing a glass-sealed LED 2 in FIG. 1.

FIG. 4 is a schematic perspective view showing the glass-sealed LED 2.

As shown in FIG. 4, the glass-sealed LED 2 is composed of a flip-chip type LED element (or LED chip) 22 which is of a GaN based semiconductor material and $7\times10^{-6}/°$ C. in thermal expansion coefficient, a ceramic board 21 which mounts the LED element 22 thereon, is of an alumina polycrystal sintered material and is $1\times10^{-6}/°$ C. in thermal expansion coefficient, and the glass seal portion 23 for sealing the LED element 22 on the ceramic board 21. The ceramic board 21 is 0.25 mm in thickness, and formed a square (in top view) with 0.7 mm sides. The LED element 22 is 0.1 mm in thickness, and formed a square (in top view) with 0.34 mm sides. The LED element 22 is mounted on the center of the ceramic board 21 such that the corresponding sides of them are parallel to each other. The glass seal portion 23 is formed a rectangular solid on the ceramic board 21, 0.48 mm in thickness and formed a square (in top view) with 0.7 mm sides. The side faces of the glass seal portion 23 are flush with those of the ceramic board 21.

Figure 5:
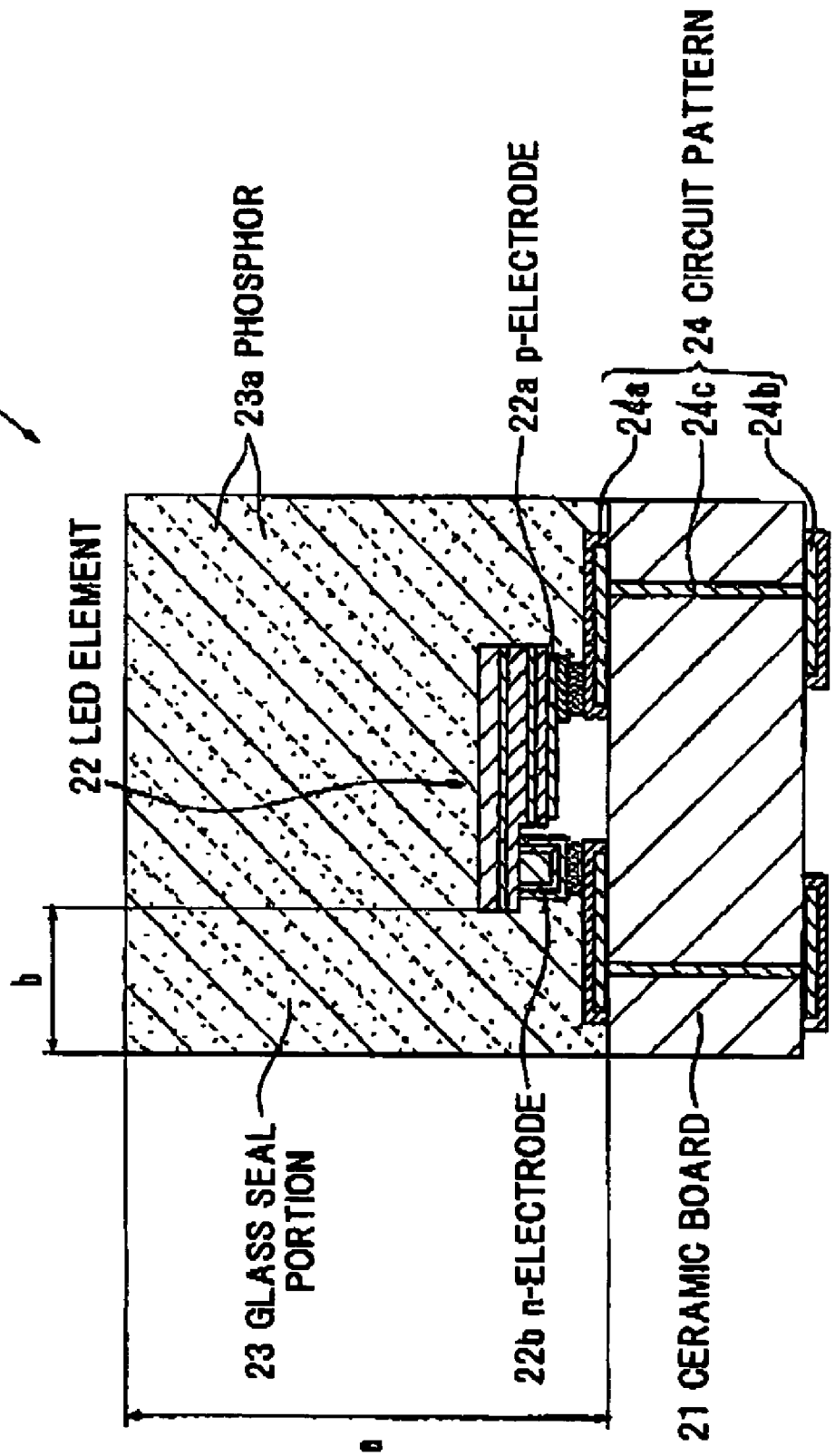
FIG. 5 is a schematic vertical cross sectional view showing the glass-sealed LED.

FIG. 5 is a schematic vertical cross sectional view showing the glass-sealed LED.

As shown in FIG. 5, the glass-sealed LED 2 is provided with a circuit pattern 24 formed on and in the ceramic board 21 for supplying power to the LED element 22. The circuit pattern 24 is composed of a top surface pattern 24a formed on the top surface of the ceramic board 21 and electrically connected to the LED element 22, an electrode pattern 24b formed on the back side of the ceramic board 21 and electrically connected to the mounting board 3, and a via pattern 24c electrically connecting the top surface pattern 24a and the electrode pattern 24b. In this embodiment, the top surface pattern 24a and the electrode pattern 24b are each composed of a tungsten (W) layer formed on the surface of the ceramic board 21, a thin-film nickel (Ni) plated layer formed on the surface of the tungsten layer, and a thin-film gold (Au) layer formed on the nickel plated layer.

The glass seal portion 23 is formed of a $ZnO$—$B_2O_3$—$SiO_2$—$Nb_2O_5$—$Na_2O$—$Li_2O$-based thermally melt glass (or thermally fused glass), and $6 \times 10^{-6}/°C$. in thermal expansion coefficient. The thermally melt glass is not limited to the above composition, may not include $Li_2O$, and may include $Zro_2$, $TiO_2$ etc. as an optional component. The glass seal portion 23 includes a phosphor 23a dispersed therein. The phosphor 23a is a yellow phosphor to emit a yellow light with a peak wavelength in a yellow region when being excited by a blue light emitted from the LED element 22. In this embodiment, phosphor 23a is of YAG (yttrium aluminum garnet). Alternatively, the phosphor 23a may be of a silicate phosphor or a mixture of YAG and a silicate phosphor mixed at a predetermined ratio.

The glass seal portion 23 as a sealing member is formed a rectangular solid such that a first distance 'a' from the LED element 22 to the top surface thereof is greater than a second distance 'b' from the LED element 22 to the side face closest thereto (See FIG. 5). Light with more yellow fraction by ratio is emitted from the top surface of the glass seal portion 23, and light with more blue fraction by ratio is emitted from the side face of the glass seal portion 23. Where the seal member is formed a rectangular solid, if the relationship between the first distance 'a' and the second distance 'b' satisfies the following expression:

$$\sqrt{2} \leq a/b,$$

the difference in chromaticity or brightness between the top surface and the side face of the glass seal portion 23 may be significantly recognized when the LED element 22 emits light. In this embodiment, the first distance 'a' is 0.48 nm and the second distance 'b' is 0.18 mm, where the relationship of the above expression is satisfied. Furthermore, if the relationship satisfies the following expression:

$$2 \leq a/b,$$

the difference in chromaticity or brightness between the top surface and the side face of the glass seal portion 23 becomes significant.

Figure 6A:
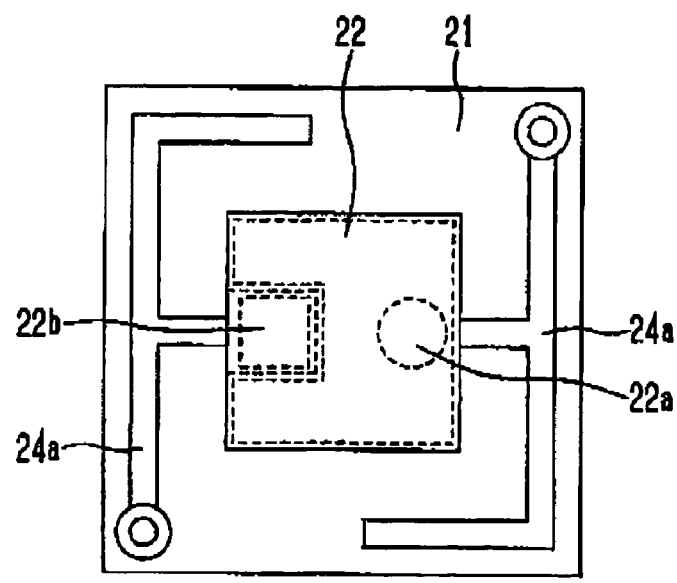
FIG. 6A is a top view showing the glass-sealed LED omitting a glass seal portion thereof.
Figure 6B:
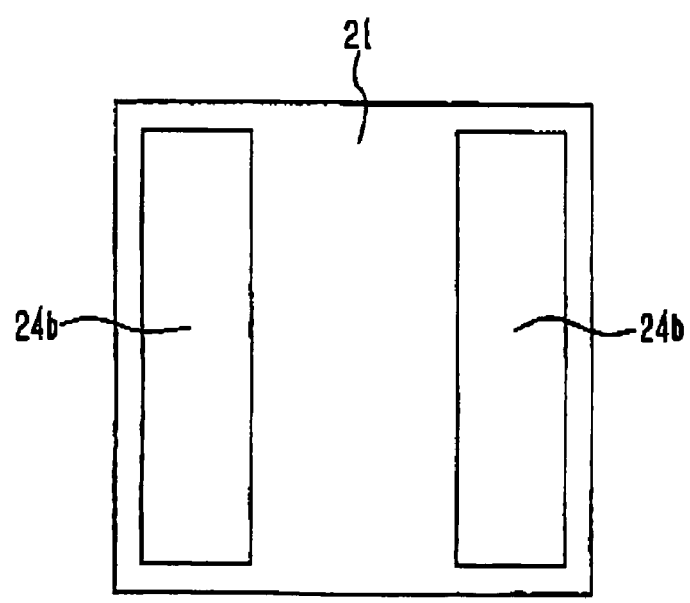
FIG. 6B is a bottom view showing the glass-sealed LED.

FIG. 6A is a top view showing the glass-sealed LED omitting the glass seal portion. FIG. 6B is a bottom view showing the glass-sealed LED.

As shown in FIG. 6A, the p-side electrode 22a and the n-side electrode 22b of the LED element 22 are each connected to the top surface pattern 24a. The top surface pattern 24a is formed extending from the mounting portion of the LED element 22 to the corner of the ceramic board 21, and the via pattern 24c described earlier is formed at the corner of the ceramic board 21.

As shown in FIG. 6B, the electrode pattern 24b is composed of a cathode electrode and an anode electrode which are separate from each other in the width direction of the ceramic board 21 and each extend in the depth direction of the ceramic board 21.

According to the light source unit 1 thus constructed, mixed light of blue light and yellow light is emitted from the glass-sealed LED 2 when a voltage is applied through the circuit pattern layer 33 of the mounting board 3 to the glass-sealed LED 2. Here, of light emitted from the LED element 22, a light component except a component perpendicular to the surface of the glass seal portion 23 is refracted at the interface between the surface of the glass seal portion 23 and the air. According to the light source unit 1 of this embodiment, most of light emitted from the LED element 22 can be refracted at the surface of the glass seal portion 23 since the glass seal portion 23 is formed a rectangular solid.

Light emitted from the glass-sealed LED 2 is inputted through the incidence surface 41 into the optical connection member 4, and a light component inputted to the reflection surface 42 is reflected toward the output surface 43. Thereby, most of light inputted to the optical connection member 4 is inputted through the output surface 43 into the light guiding member 5, and the light guiding member 5 emits light from its entire body. Meanwhile, since most of light emitted from the glass-sealed LED 2 is refracted at the surface of the glass seal portion 23, most of light components inputted to the light guiding member 5 are not perpendicular to the incidence surface 51 of the light guiding member 5. In other words, most of light components inputted to the light guiding member 5 are not parallel to each other.

Here, focusing on the glass-sealed LED 2, light emitted sideward from the LED element 22 is little inputted to the ceramic board 21 and to the circuit pattern 24 with the gold plating exhibiting large absorption for blue light and, thus, directly reaches the side face of the glass seal portion 23 at a high rate since the second distance 'b' is smaller than the first distance 'a' and the scattering distance is short not to increase the degree of scattered light. Therefore, light inputted to the ceramic board 21 and the circuit pattern 24, which causes absorption of light, can be reduced, so that the amount of light outputted from the glass-sealed LED 2 to the optical connection member 4 can be significantly increased to enhance the brightness of the light guiding member 5.

On the other hand, since the first distance 'a' is longer than the second distance 'b', light emitted from the side face of the glass seal portion 23 is bluish due to the low wavelength conversion rate by the phosphor 23a, and light emitted from the top surface of the glass seal portion 23 is yellowish due to the high wavelength conversion rate. Light emitted from the side face of the glass seal portion 23 is relatively high in brightness, and light emitted from the top surface of the glass seal portion 23 is relatively low in brightness per unit area. This is because, although light emitted from the side face is relatively high in optical energy, light emitted from the top surface is relatively high in visibility (or luminosity) since it is high in conversion rate for converting from blue to yellow by the phosphor. Thus, light emitted from the glass-sealed LED 2 to the optical connection member 4 causes unevenness in chromaticity and brightness depending on its radiation angle.

However, when the glass-sealed LED 2 side is viewed from the light guiding member 5 side, the mirrored light source of the glass-scaled LED 2 reflected on the reflection surface 42 is seen as well as the real light source of the glass-sealed LED 2. Thereby, in the real light source of the glass-sealed LED 2, the yellow light component is more on the optical axis side and the blue light component is more on the perpendicular side to the optical axis. By contrast, in the mirrored light source reflected on the reflection surface 42, the blue light component is more on the optical axis side and the yellow light component is more on the perpendicular side to the optical axis.

Herein, the optical axis is defined as a center axis of the glass-sealed LED 2. In this embodiment, the optical axis is coincident with the center axis of the light guiding member 5. Herein, the optical axis side is defined as an angle range of 0 to 45 degrees to the optical axis, and the perpendicular side to the optical axis is defined as an angle range of 45 to 90 degrees to the optical axis. In fact, in the direction perpendicular to the optical axis, the rate of scattering light by the phosphor 23a increases while the light distribution radiated from the LED element 22 is small and, therefore, the angle with blue light component increased may be limited on the perpendicular side to the optical axis. In this embodiment, the practical angle range of the increased blue light component on the perpendicular side to the optical axis is 45 to 75 degrees to the optical axis. Since light inputted to the light guiding member 5 is obtained by superposing the mirrored light source reflected toward the optical axis side by the reflection surface 42 on the real light source, the light distribution characteristic of light outputted from the side face of the glass seal portion 23 is superposed on the light distribution characteristic of light outputted from the top surface of the glass seal portion 23, so that both lights can be well mixed. Further, since light inputted through the incidence surface 51 into the light guiding member 5 is multiply reflected inside the light guiding member 5, the mixing of both lights can be promoted. In more detail, of light outputted from the side face of the glass seal portion 23, a lower component near the ceramic board 21 includes relatively much blue light and an upper component away from the ceramic board 21 and near the top surface of the glass seal portion 23 includes relatively much yellow light. These light components can be also multiply reflected inside the light guiding member 5 so as to promote the mixing of the blue component-rich light and yellow component-rich light. Thus, at the emission surface of the light guiding member 5, surface emission or luminescence with uniform chromaticity and brightness can be realized without causing unevenness in chromaticity and brightness.

With respect to unevenness in chromaticity, color discrimination criterion depends on spectra. For example, in case of a single wavelength, the color discrimination criterion is 1 to 7 nm. For example, in white region, if the difference between chromaticity 'x' and chromaticity 'y' in the chromaticity coordinate system is 0.02, the discrimination can be recognized enough. The criterion or value to indicate the occurrence of unevenness in chromaticity is only for exemplification and depends on specifications required to the light source unit 1. However, in this embodiment, the difference between chromaticity 'x' and chromaticity 'y' at the emission surface of the light guiding member 5 is less than 0.02, where it is confirmed that the unevenness in chromaticity can be effectively reduced.

According to the light source unit 1 of this embodiment, since the second distance 'b' is smaller than the first distance 'a', the light source unit 1 can be downsized in the width and depth directions thereof. In other words, where a light collection optical system is provided for a light source, when the light collection optical system is constant in size ratio to the light source, the same radiation characteristic can be obtained. In this embodiment, according as the size of the glass-sealed LED 2 as a light source can be reduced, the size of the incidence surface 41 or the reflection surface 42 can be reduced. In addition, since the light guiding member 5 uses the cylindrical shape extending in the direction perpendicular to the mounting board 3, it can be narrowed in the width and depth directions to downsize the unit. If the light guiding member 5 forms the outline of the light source unit 1 and the diameter of the light guiding member 5 is the same as the light source unit 1, the optical coupling efficiency can be enhanced relative to the dimensions of the light source unit 1 and this is very advantageous in practical use.

When the first distance 'a' is made longer than the second distance 'b', the glass-sealed LED 2 may cause a problem that chromaticity is different between in the optical axis direction and in the perpendicular direction to the optical axis. However, it has high external radiation efficiency and a reduced dimension in the perpendicular direction to the optical axis. Even when the size of the optical connection member 4 for reflecting light emitted from the side face of the glass-sealed LED 2 is reduced, the light can be reflected in the direction of high optical coupling efficiency to the light guiding member 5. Thus, since the size of the optical connection member 4 can be reduced, the optical coupling efficiency can be kept high even when the diameter (or horizontal cross section size) of the light guiding member 5 is reduced according to the size of the optical connection member 4. Further, by the multiple reflections inside the light guiding member 5, the bluish light can be well mixed with the yellowish light when being externally radiated from the light guiding member 5. Therefore, the chromaticity difference problem due to the first distance 'a' longer than the second distance 'b' can be solved. Accordingly, the high-efficiency and compact light source unit 1 can be provided which have overcome the chromaticity difference problem caused by the downsizing.

The sealing material is of the inorganic material (i.e., glass in this embodiment) that is within two times in thermal expansion coefficient relative to the LED element 22, and the board is of the polycrystalline material that is within two times in thermal expansion coefficient relative to the LED element 22. Therefore, peeling or cracking can be prevented which is caused by the difference in thermal expansion coefficient between the sealing material and the board as in the sealing material of a resin material that is ten times or more in thermal expansion coefficient relative to the LED element 22. In addition, since the sealing material penetrates into the uneven polycrystalline grain boundary on the board, the sealing material can be firmly bonded to the board by its anchor effect. In this embodiment, since the sealing material is of thermally melt glass, chemical bonding force to the ceramic board 21 can be also generated to further enhance the bonding force thereto. Thus, even when the second distance 'b' is 0.3 mm or less, peeling at the bonding surface between the LED element 22 and the glass seal portion 23 or between the glass seal portion 23 and the ceramic board 21 can be prevented to provide a high-reliability package.

Meanwhile, instead of the inorganic sealing material or the ceramic board exemplified in this embodiment, in combination with the LED element 22 with a thermal expansion coefficient of $7\times10^{-6}/°$ C., phosphate glass with a thermal expansion coefficient of $12\times10^{-6}/^\circ$ C. may be used as the sealing material and glass-containing alumina with a thermal expansion coefficient of $13\times10^{-6}/^\circ$ C. may be used as the ceramic board 21. In this case, since the sealing material is subject to peeling or cracking when a thermal expansion coefficient thereof exceeds two times that of the LED element 22, the difference in thermal expansion coefficient between the LED element 22 and the sealing material is desirably within two times.

Figure 7:
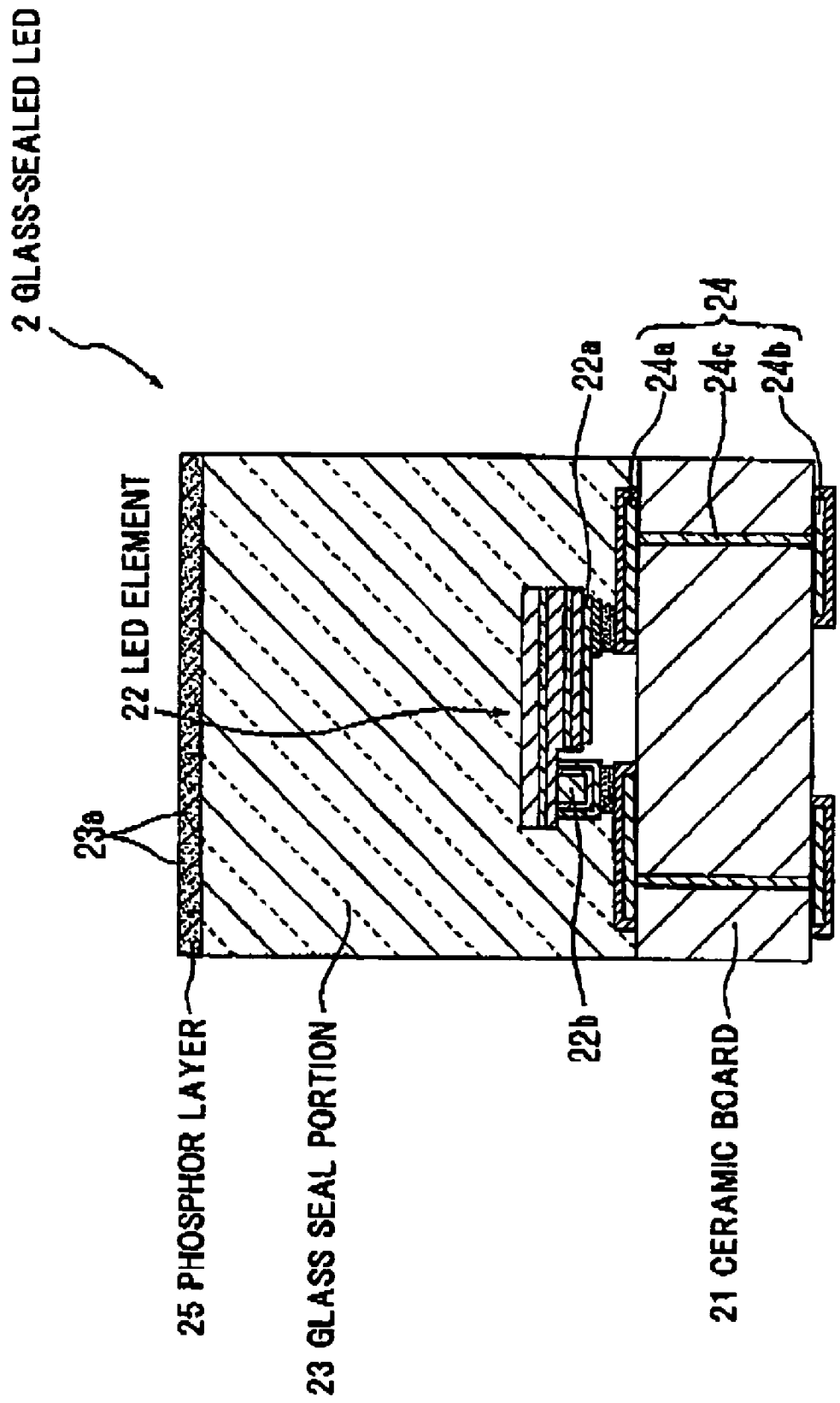
FIG. 7 is a schematic vertical cross sectional view showing a glass-sealed LED in a modification.

In this embodiment, the phosphor 23*a* is dispersed in the glass seal portion 23 of the glass-sealed LED 2. Alternatively, instead of dispersing the phosphor 23*a* in the glass seal portion 23, as shown in FIG. 7, a phosphor layer 25 formed of a transparent material such as resin and glass with the phosphor 23*a* dispersed therein may be formed on the top surface of the glass seal portion 23. The phosphor layer 25 can be made by dispersing the phosphor 23*a* in sol-gel glass derived from alkoxide as a raw material and formed by being burned in on the top surface of the glass seal portion 23. For example, it may be burned in by using heat generated upon the hot pressing conducted for forming the glass-sealed LED 2. Thereby, the workability can be enhanced, and the phosphor 23*a* can be firmly bonded to the glass seal portion 23 since the phosphor 23*a* particles can be almost embedded in the glass seal portion 23.

Figure 8:
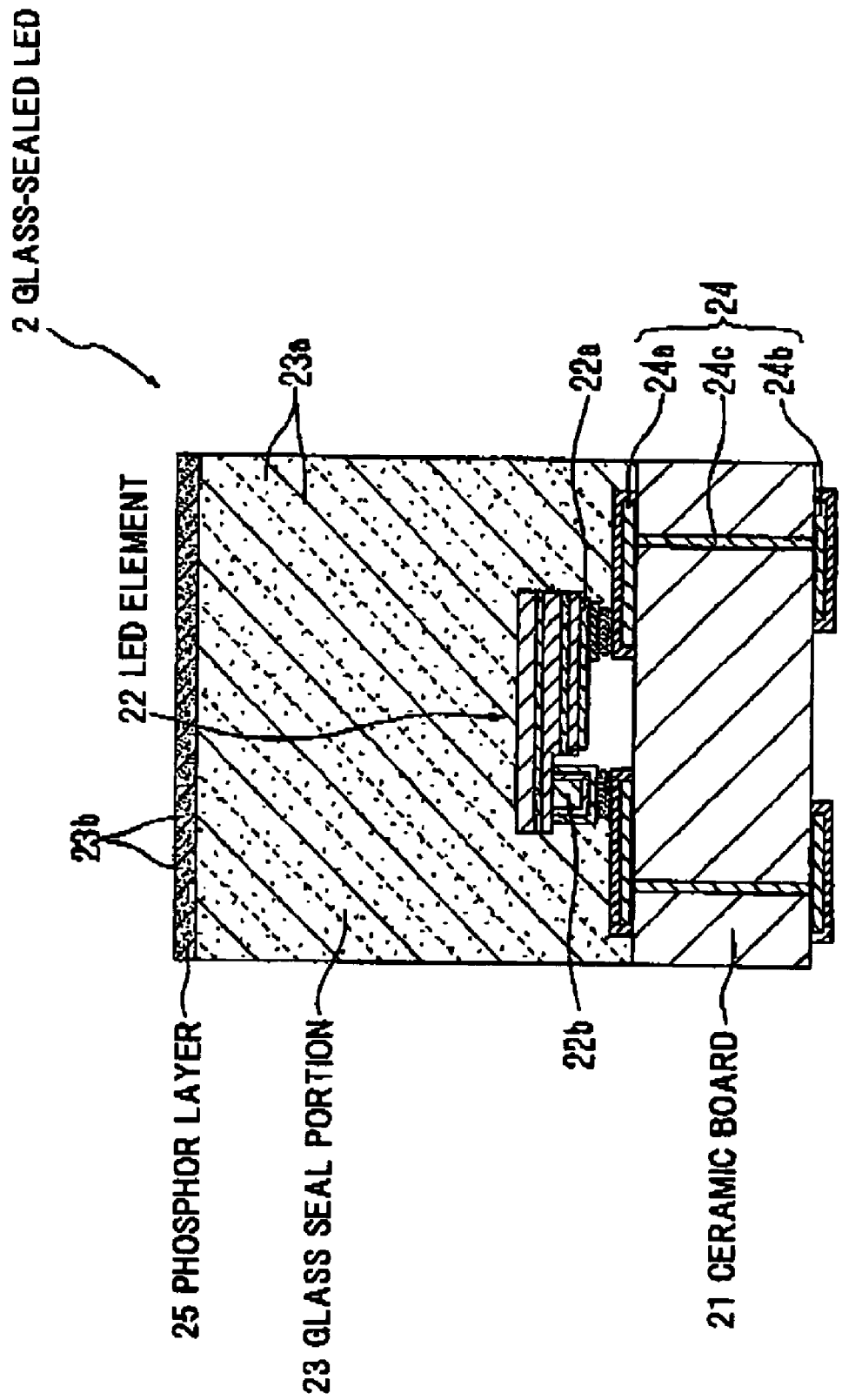
FIG. 8 is a schematic vertical cross sectional view showing a glass-sealed LED in another modification.

In another modification, as shown in FIG. 8, a phosphor layer 25 formed of a transparent material with a phosphor 23*b* (with a fluorescence wavelength different from the phosphor 23*a*) dispersed therein may be formed on the top surface of the glass seal portion 23 while having the phosphor 23*a* dispersed in the glass seal portion 23. In this case, the LED element 22 may have an emission wavelength in ultraviolet region, the phosphor 23*a* in the glass seal portion 23 may be blue and red phosphors to be excited by UV light, and the phosphor 23*b* of the phosphor layer 25 may be a green phosphor to be excited by UV light.

Figure 9:
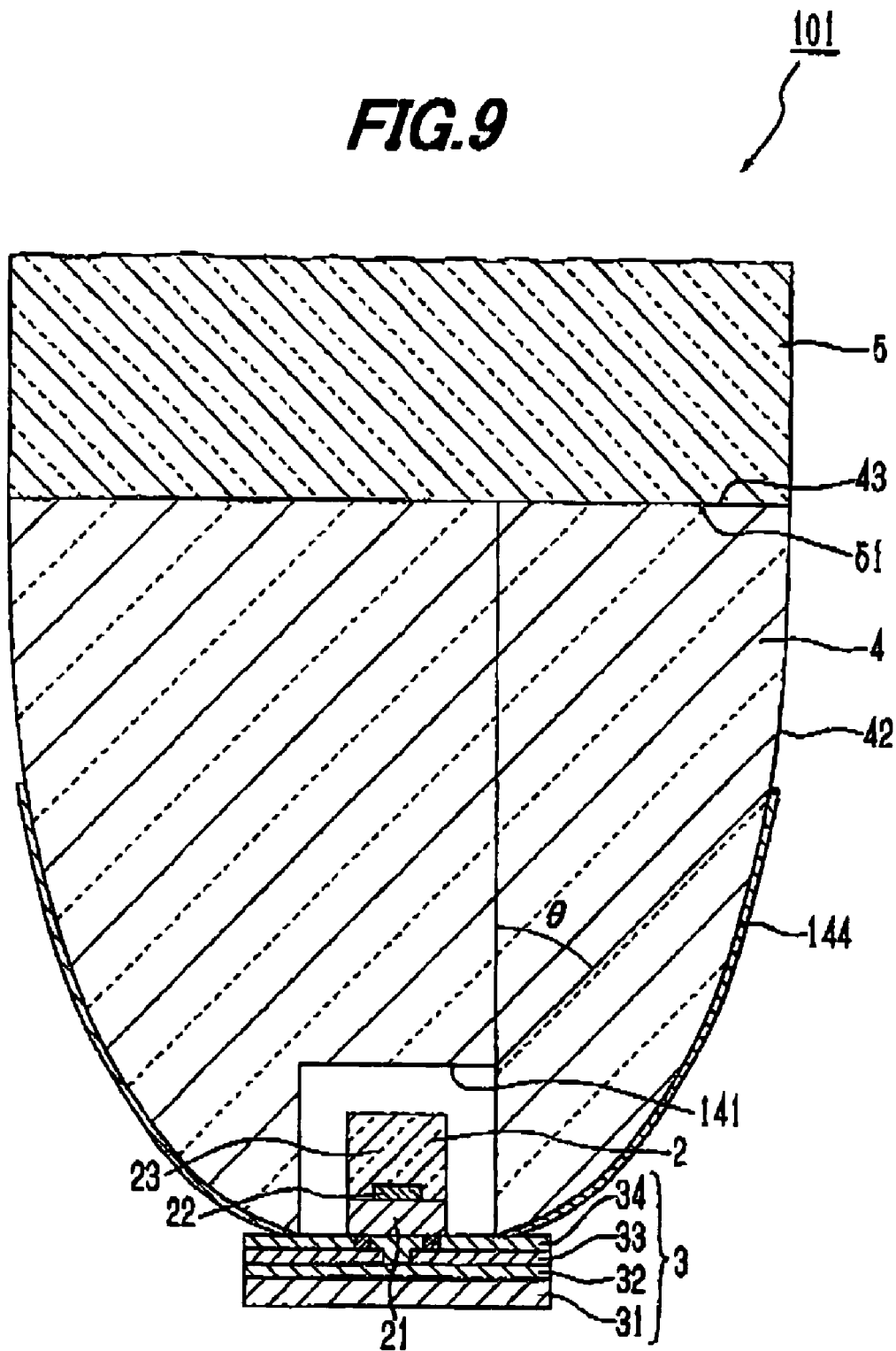
FIG. 9 is a schematic vertical cross sectional view showing a light source unit in a modification.

In this embodiment, the incidence surface 41 of the optical connection member 4 is formed hemispherical. Instead, as shown in FIG. 9, the optical connection member 4 may have a flat incidence surface 141 such that the glass-sealed LED 2 is enclosed in a rectangular solid concave portion. As shown in FIG. 9, the reflection surface 42 of the optical connection member 4 is partially provided with a reflection film 44 formed thereon. The reflection film 44 is preferably formed in such a region that an incident angle can be defined greater than critical angle θ of the optical connection member 4 to the optical axis of the glass-sealed LED 2, with reference to the glass-sealed LED 2. Thereby, light leaking out of the unit from the reflection surface 42 can be prevented so as to enhance coupling efficiency between the glass-sealed LED 2 and the light guiding member 5.

Figure 10:
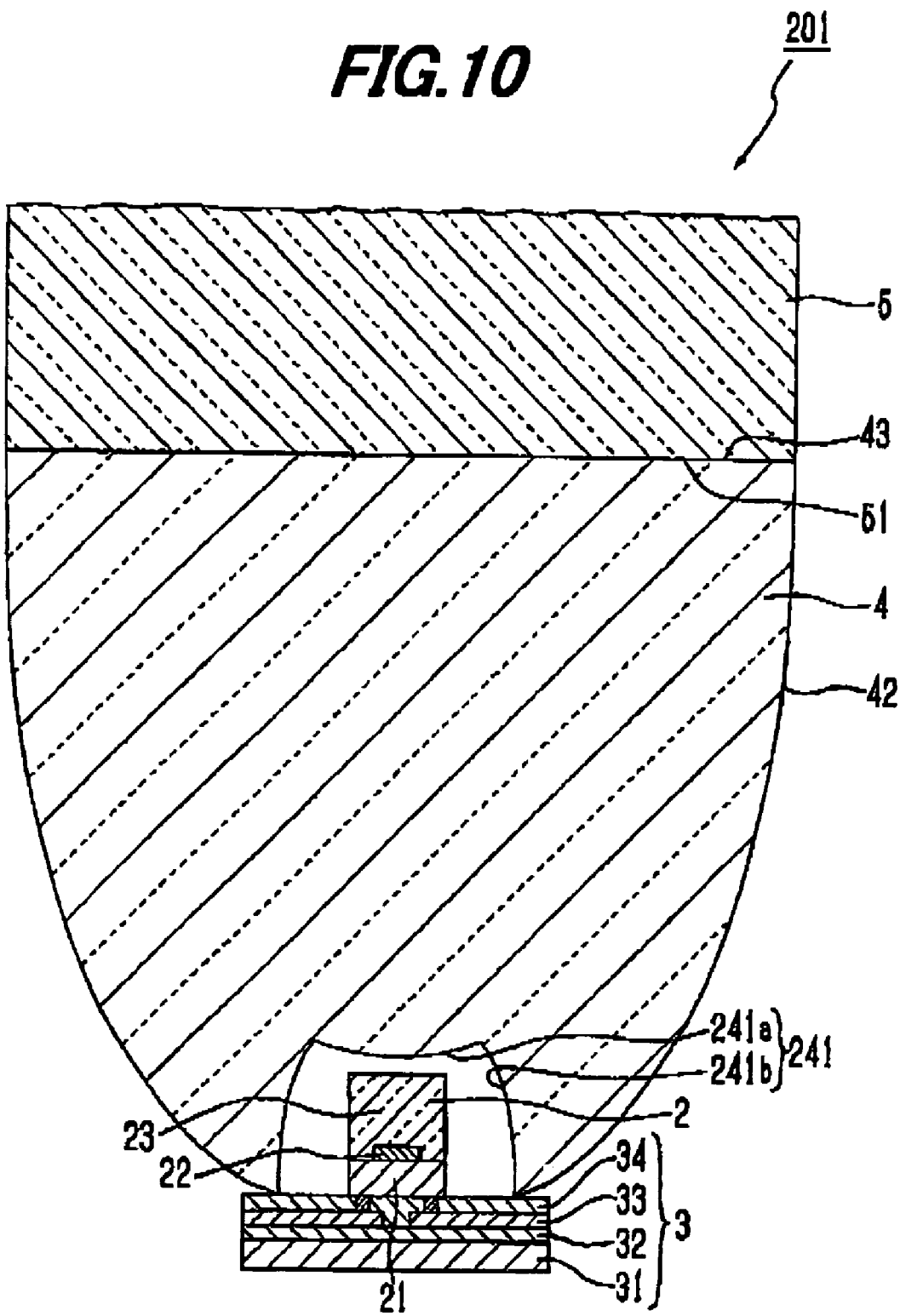
FIG. 10 is a schematic vertical cross sectional view showing a light source unit in another modification.

In another modification, as shown in FIG. 10, the optical connection member 4 may have an incidence surface 241 over the glass-sealed LED 2 such that light can be focused in the optical axis direction of the glass-sealed LED 2. A light source unit 201 in FIG. 10 is modified such that the incidence surface 241 is composed of a lens surface 241*a* formed over the glass-sealed LED 2 and concave to the light guiding member 5 and a curved surface 241*b* formed on the side of the glass-sealed LED 2 and nearly spherical around the glass-sealed LED 2, which are continued.

Figure 11:
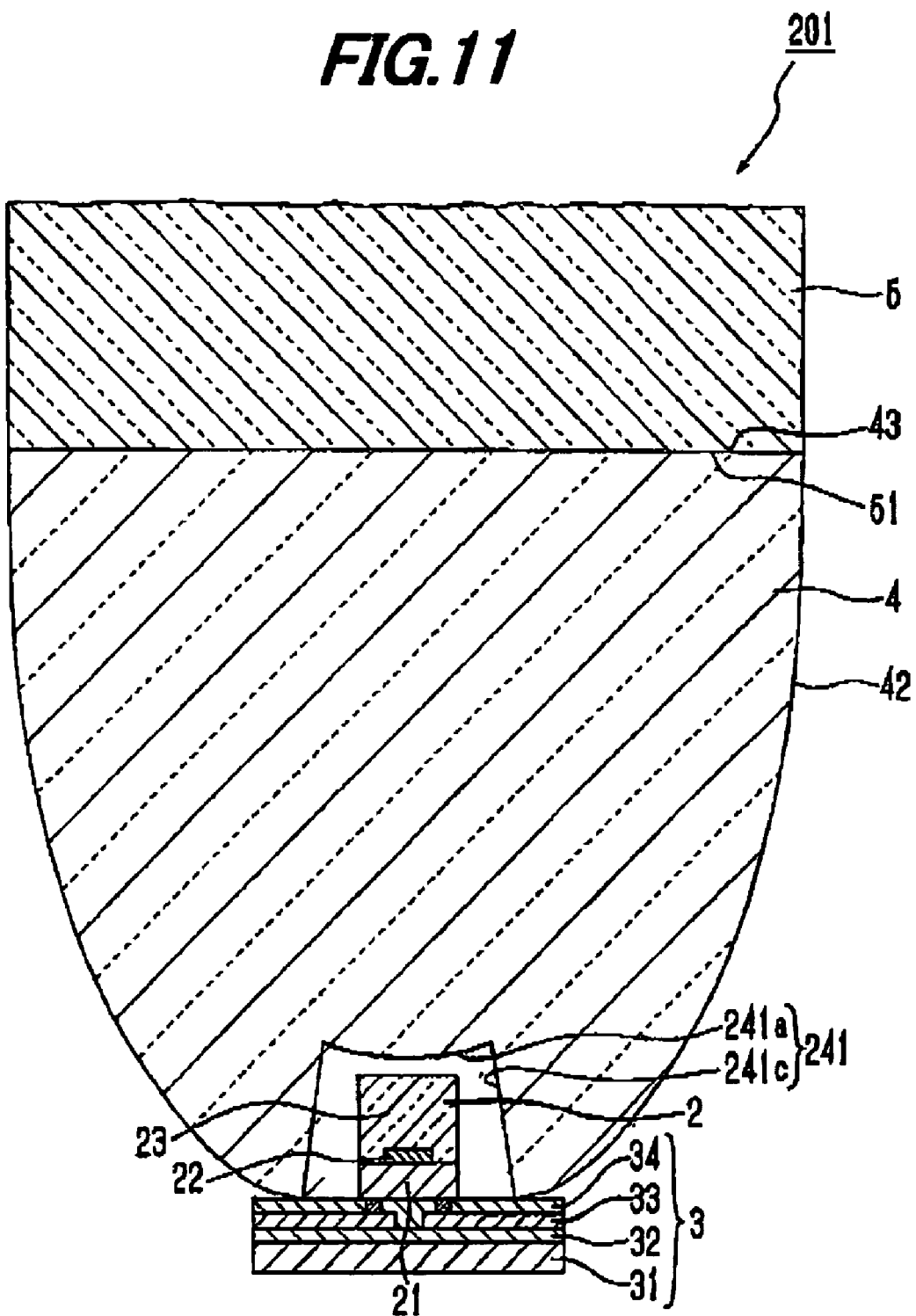
FIG. 11 is a schematic vertical cross sectional view showing a light source unit in another modification.

Instead, as shown in FIG. 11, an incidence surface 241 may be composed of the lens surface 241*a* and a conical surface 241*c* formed on the side of the glass-sealed LED 2, which are continued. Thereby, in producing the optical connection member 4 by using a mold, the stripping or releasing from the mold can be facilitated. In addition, light emitted laterally from the glass-sealed LED 2 is refracted at the incidence surface 241 toward the center axis such that the incident angle of light inputted to the reflection surface 42 can be increased to enhance the light extraction efficiency. The incidence surface 241*c* is preferably inclined 10 degrees or less to the optical axis of the glass-sealed LED 2.

Figure 12:
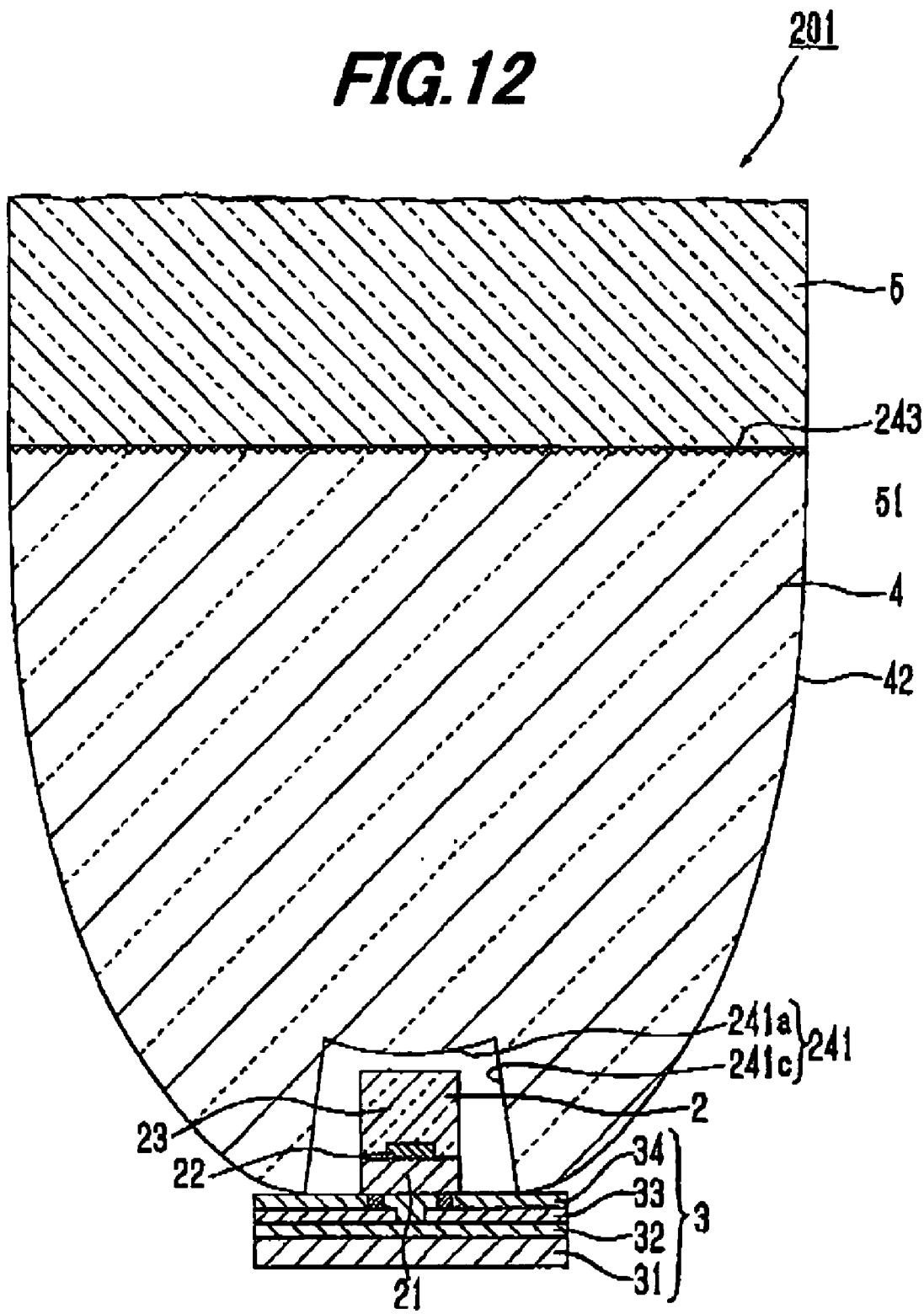
FIG. 12 is a schematic vertical cross sectional view showing a light source unit in another modification.

In another modification, as shown in FIG. 12, an output surface 243 may be roughened to scatter light emitted from the optical connection member 4. In FIG. 12, the output surface 243 is formed such that light outputted parallel to the center axis is scattered within 15 degrees to the center axis. Thus, by roughening the output surface 243, yellow light and blue light can be well mixed at a distant emission surface even when the light guiding member 5 is omitted.

Second Embodiment

Figure 13:
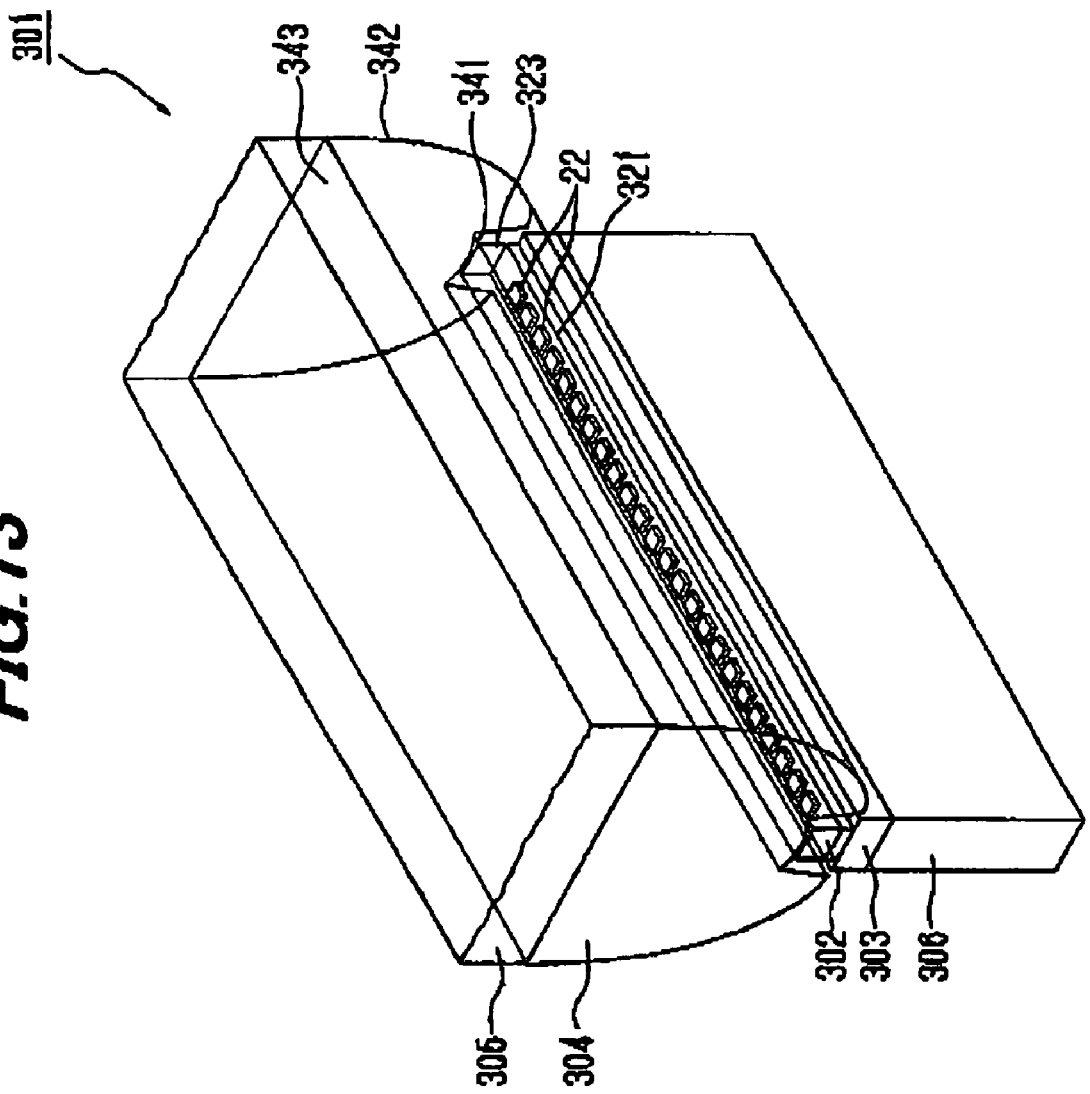
FIG. 13 is a schematic perspective view showing a light source unit in a second preferred embodiment according to the invention.

FIGS. 13 to 16 show the second preferred embodiment of the invention. FIG. 13 is a schematic perspective view showing a light source unit in the second preferred embodiment according to the invention.

As shown in FIG. 13, the light source unit 301 is composed of a mounting board 303 on which a glass-sealed LED 302 is mounted, an optical connection member 304 into which light emitted from the glass-sealed LED 302 is inputted, a light guiding member 305 into which light outputted from the optical connection member 304 is then inputted, and a radiator plate 306 which is attached to the bottom of the mounting board 303 and extends down from the mounting board 303. The light source unit 301 is constructed such that, when the glass-sealed LED 302 emits light, the transparent and cylindrical light guiding member 305 radiates light from its entire body.

The glass-sealed LED 302 extends in the depth direction and is formed a rectangular solid which has a dimension in the vertical direction longer than that in the width direction, and stands on the mounting board 303. In this embodiment, the glass-sealed LED 302 is composed such that twenty-four LED elements 22 are in line arranged in the depth direction (or in the longitudinal direction) and they are sealed together by a rectangular solid glass seal portion 323 extending in the depth direction. The LED elements 22 are connected in series and emit light with a peak wavelength of 460 nm at forward voltage and current of 4.0 V and 100 mA, respectively. Where the twenty-four LED elements 22 are connected in series, using a domestic power supply of AC100V, a forward voltage of about 4.0 V is applied to each of the LED elements 22 to allow a given operation thereof.

The mounting board 303 is formed extending linearly in the depth direction. The radiator plate 306 is of metal and has surfaces extending in the depth direction. The mounting board 303 is the same width as the radiator plate 306 and bonded via solder (not shown) to the upper end face of the radiator plate 306. The optical connection member 304 is a cylindrical lens having the same cross section and extending in the depth direction, and an incidence surface 341 thereof encloses the top and sides (in the width direction) of the glass-sealed LED 302 while being disposed away from the glass-sealed LED 302. The optical connection member 304 is, on the top, provided with a flat output surface 343 which is connected to the end face of the planar light guiding member 305.

Figure 14:
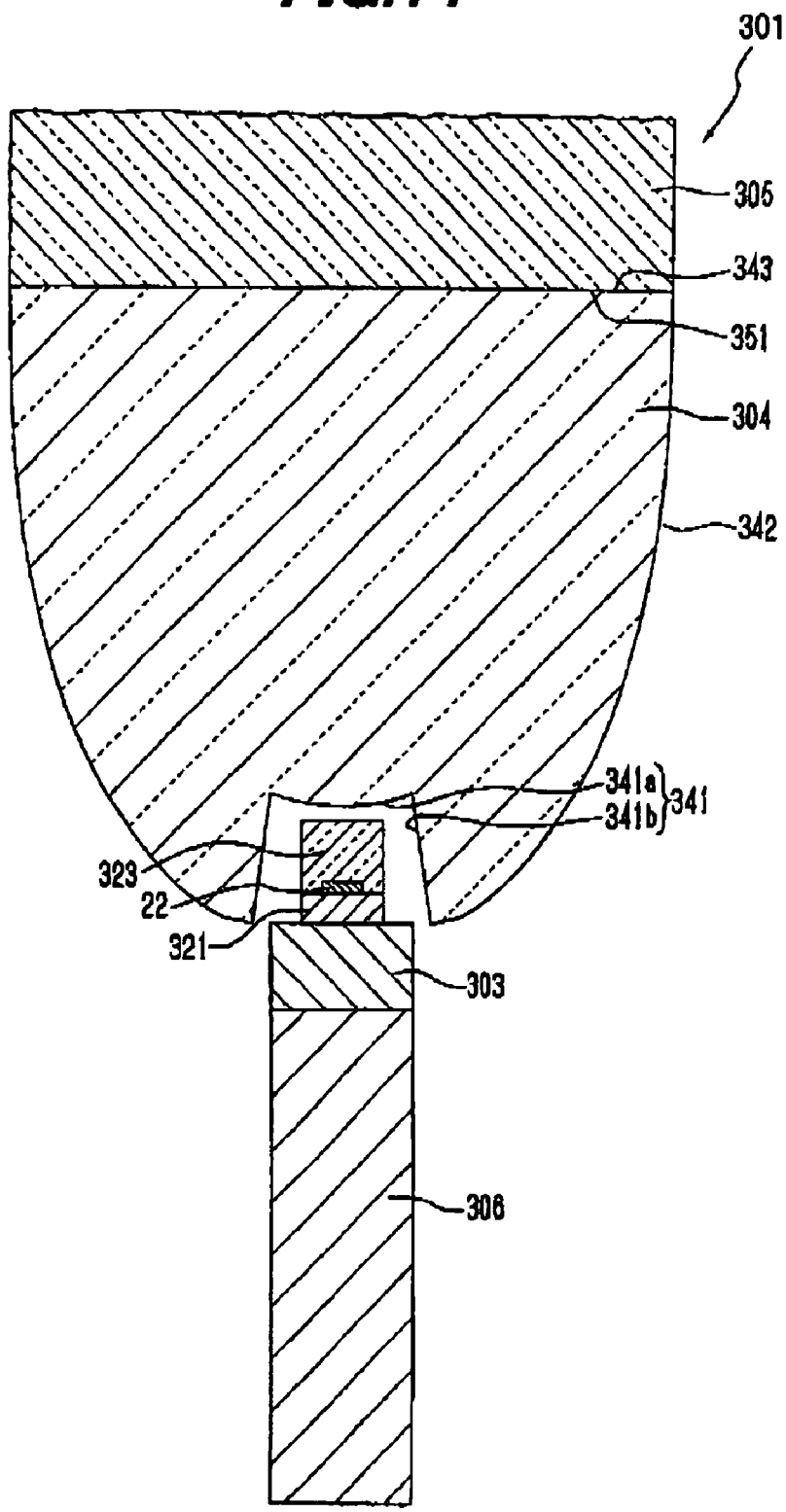
FIG. 14 is a schematic vertical cross sectional view showing the light source unit in FIG. 13.

FIG. 14 is a schematic vertical cross sectional view showing the light source unit in FIG. 13.

As shown in FIG. 14, the glass-sealed LED 302 is formed narrower in the width direction than the mounting board 303 and the radiator plate 306. For example, the glass-sealed LED 302 is 0.7 mm in width, and the mounting board 303 and the radiator plate 306 are 0.9 nm in width.

The optical connection member 304 is provided with a reflection surface 342 that is formed nearly a paraboloidal surface with the glass-sealed LED 302 located at a focal point thereof (in front view). The incidence surface 341 of the optical connection member 304 is composed of a lens surface 341a opposite the top face of the glass-sealed LED 302, a pair of tapered surfaces 341c opposite the sides of the glass-sealed LED 302, which are continued. The lens surface 341a is formed concave to the light guiding member 305 to focus light emitted from the top face of the glass-sealed LED 302 in the optical axis direction of the glass-sealed LED 302. The tapered surfaces 341c are formed inclined downward and outward from both ends of the lens surface 341a. The tapered surfaces 341c are to refract light emitted from the side faces of the glass-sealed LED 302 in the optical axis direction of the glass-sealed LED 302.

Figure 15:
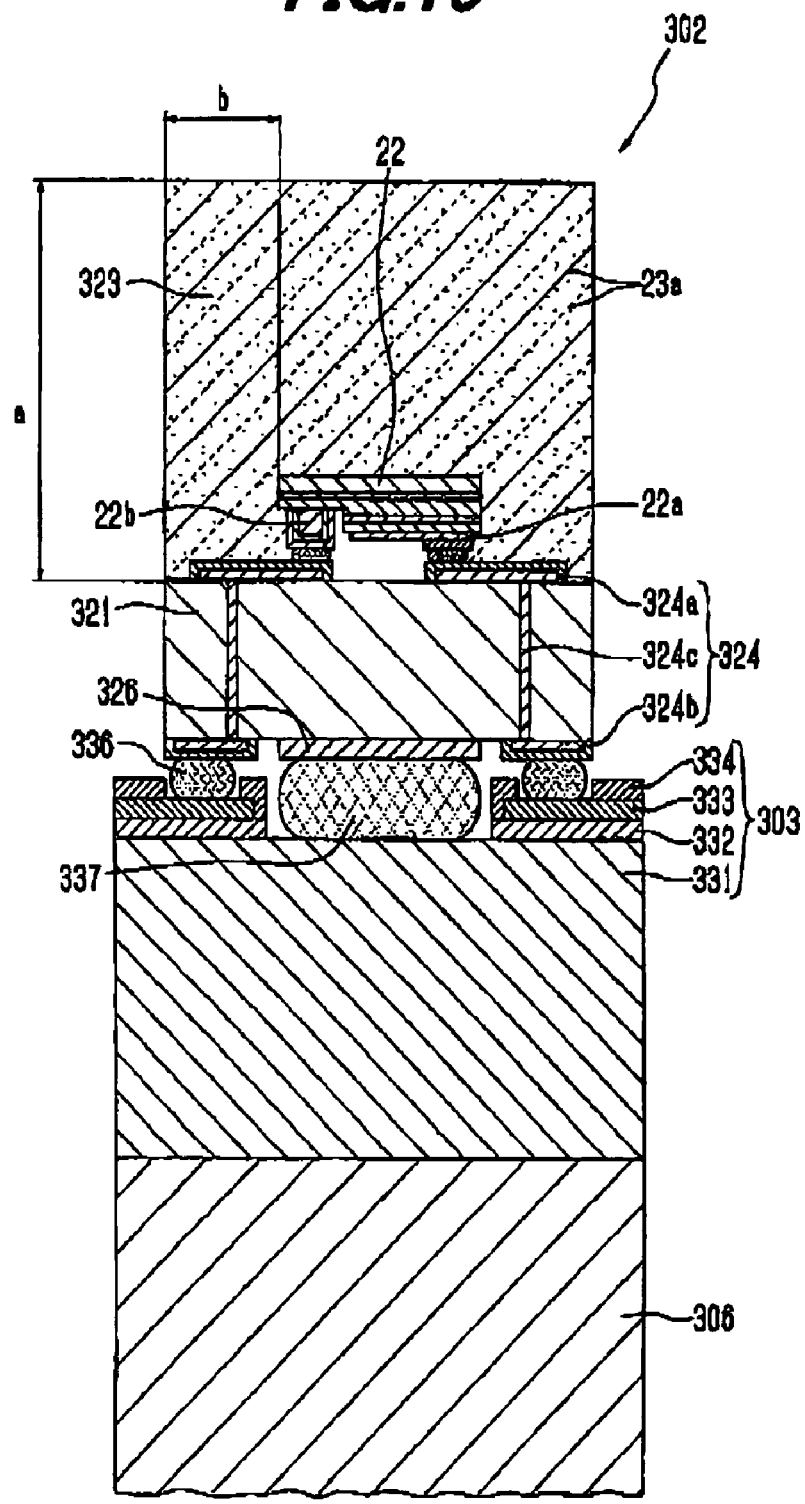
FIG. 15 is a schematic enlarged vertical cross sectional view showing a part of the light source unit in FIG. 13.

FIG. 15 is a schematic enlarged vertical cross sectional view showing a part of the light source unit in FIG. 13.

As shown in FIG. 15, the glass-sealed LED 302 is composed of a flip-chip type LED element 22, a ceramic board 321 on which the LED element 22 is mounted, a circuit pattern 324 formed on the ceramic board 321 for supplying power the LED element 22, and a glass seal portion 323 for sealing the LED element 22 on the ceramic board 321. The LED element 22, the ceramic board 321, the circuit pattern 324 and the glass seal portion 323 are formed of the same materials as those of the glass-sealed LED 2 in the first embodiment, and the phosphor 23a is dispersed in the glass seal portion 323.

The glass seal portion 323 is formed a rectangular solid such that a first distance 'a' from the LED element 22 to the top surface thereof is greater than a second distance 'b' from the LED element 22 to the side face closest thereto. In this embodiment, the first distance 'a' is 0.48 mm and the second distance 'b' is 0.18 mm.

The LED element 22 is disposed such that a p-side electrode 22b and an n-side electrode 22b are arranged in the width direction of the mounting board 303. The circuit pattern 24 is composed of a top surface pattern 324a formed on the top surface of the ceramic board 321 and electrically connected to the LED element 22, an electrode pattern 324b formed on the bottom of the ceramic board 321 and electrically connected to the mounting board 303, and a via pattern 324c electrically connecting the top surface pattern 324a and the electrode pattern 324b. A radiator pattern 326 is formed between the electrode patterns 324b on the bottom of the ceramic board 321. The radiator pattern 326 is formed just under the LED element 22 so as to overlap with the LED element 22 (in top view).

The mounting board 303 is composed of, formed in the following order from the radiator plate 306, a metal base portion 331, an insulation layer 332, a circuit pattern layer 333 and a white resist layer 334. The metal base portion 331 is of, e.g., copper (with a thermal conductivity of 380 W·m$^{-1}$K$^{-1}$), and connected via a solder material 337 to the radiator pattern 326 of the glass-sealed LED 302. The insulation layer 332 is of, e.g., polyamide resin, epoxy resin etc., and serves to insulate the conductive metal base portion 331 from the circuit pattern layer 333. The circuit pattern layer 333 is of, e.g., copper with a gold film formed on the surface (upper surface) thereof, and electrically connected via a solder material 336 to the electrode pattern 324b of the glass-sealed LED 302. The white resist layer 334 is of, e.g., epoxy resin with titanium oxide fillers mixed therein, and serves to increase the reflectivity of the top surface of the mounting board 303.

Figure 16:
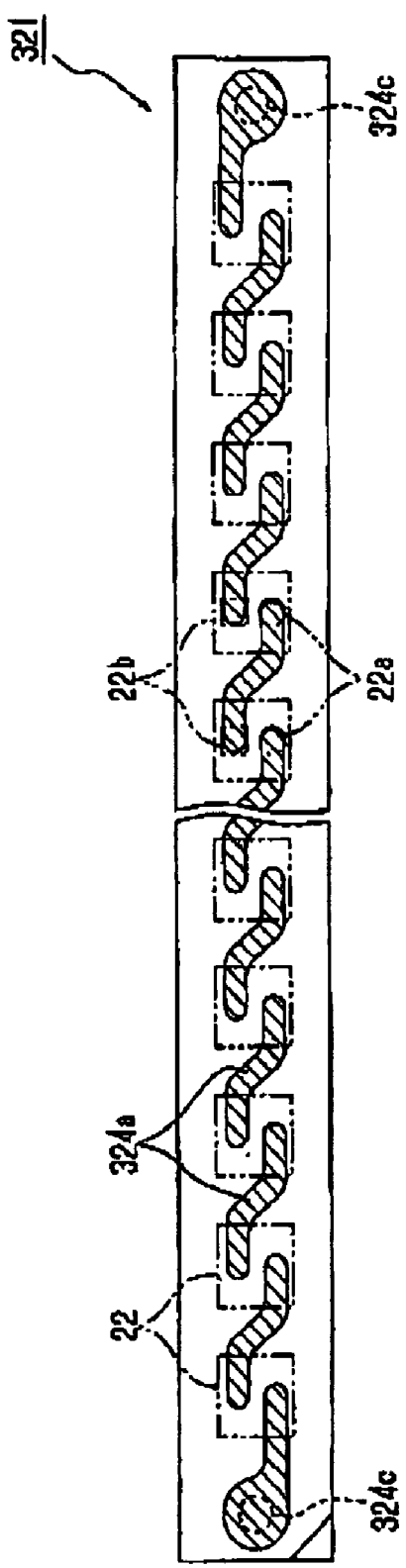
FIG. 16 is a top view showing a ceramic board of a glass-sealed LED in FIG. 13.

FIG. 16 is a top view showing the ceramic board of the glass-sealed LED in FIG. 13.

As shown in FIG. 16, the ceramic board 321 is provided with the top surface pattern 324a for electrically connecting in series the plural LED elements 22. In this embodiment, the top surface pattern 324a is connected to the via patterns 324c at both ends of the ceramic board 321 in the longitudinal direction. The top surface pattern 324a is connected to the p-side electrode 22a of a specific LED element 22 at its one end in the width direction of the ceramic board 321, and to the n-side electrode 22b of an LED element 22 next to the specific LED element 22 at its other end in the width direction of the ceramic board 321. Thus, the top surface pattern 324a is formed inclined in the width direction to the longitudinal direction of the ceramic board 321 between LED elements 22.

According to the light source unit 301 thus constructed, mixed light of blue light and yellow light is emitted from the glass-sealed LED 302 when a voltage is applied through the circuit pattern layer 333 of the mounting board 303 to the glass-sealed LED 302. Here, most of light emitted from the LED element 22 can be refracted at the surface of the glass seal portion 323 since the glass seal portion 323 is formed a rectangular solid.

Most of light inputted to the optical connection member 4 from the glass-sealed LED 302 is inputted through the output surface 343 into the light guiding member 305, and the light guiding member 305 emits light from its entire body. Meanwhile, since most of light emitted from the glass-sealed LED 302 is refracted at the surface of the glass seal portion 323, most of light components inputted to the light guiding member 305 are not perpendicular to the incidence surface 351 of the light guiding member 305. In other words, most of light components inputted to the light guiding member 305 are not parallel to each other.

Here, focusing on the glass-sealed LED 302, light emitted sideward from the LED element 22 is little inputted to the ceramic board 321 and to the circuit pattern 324 with the gold plating exhibiting large absorption for blue light since the second distance 'b' is smaller than the first distance 'a'. Therefore, light inputted to the ceramic board 321 and the circuit pattern 324, which causes absorption of light, can be reduced, so that the amount of light outputted from the glass-sealed LED 302 to the optical connection member 304 can be significantly increased to enhance the brightness of the light guiding member 305.

On the other hand, since the first distance 'a' is longer than the second distance 'b', light emitted from the side face of the glass seal portion 323 is relatively high in brightness, and light emitted from the top surface of the glass seal portion 323 is relatively low in brightness per unit area. In addition light emitted from the side face of the glass seal portion 323 is relatively low in wavelength conversion efficiency, and light emitted from the top surface of the glass seal portion 323 is relatively high in wavelength conversion efficiency. Thus, light emitted from the glass-sealed LED 302 to the optical connection member 304 causes unevenness in chromaticity and brightness depending on its radiation angle.

However, when the glass-sealed LED 302 side is viewed from the light guiding member 305 side, the mirrored light source of the glass-sealed LED 302 reflected on the reflection surface 342 is seen as well as the real light source of the glass-sealed LED 302. Thereby, in the real light source of the glass-sealed LED 302, the yellow light component is more on the optical axis side and the blue light component is more on the perpendicular side to the optical axis. By contrast, in the mirrored light source reflected on the reflection surface 342, the blue light component is more on the optical axis side and the yellow light component is more on the perpendicular side to the optical axis.

Since light inputted to the light guiding member 305 is obtained by superposing the mirrored light source reflected toward the optical axis side by the reflection surface 342 on the real light source, the light distribution characteristic of light outputted from the side face of the glass seal portion 323 is superposed on the light distribution characteristic of light outputted from the top surface of the glass seal portion 323, so that both lights can be well mixed. Further, since light inputted through the incidence surface 351 into the light guiding member 305 is multiply reflected inside the light guiding member 305, the mixing of both lights can be promoted. Thus, at the emission surface of the light guiding member 305, surface emission or luminescence with uniform chromaticity and brightness can be realized without causing unevenness in chromaticity and brightness.

According to the light source unit 301 of this embodiment, since the second distance 'b' is smaller than the first distance 'a', the light source unit 301 can be downsized in the width direction thereof. In particular, since the light guiding member 5 uses the flat plate shape extending in the direction perpendicular to the mounting board 303, it can be narrowed in the width direction to downsize the unit and this is very advantageous in practical use.

Heat generated from the LED elements 22 of the glass-sealed LED 302 is conducted through the ceramic board 321, the radiator pattern 326 etc. to the metal base portion 331. Here, the p-side electrode 22a and the n-side electrode 22b of the LED element 22 are arranged in the width direction (i.e., in the direction perpendicular to the arranging direction of the LED element 22) such that the LED element 22 contacts the ceramic board 321 at the two points in the width direction, so that heat can be more efficiently conducted from the LED element 22 to the ceramic board 321 than the case of contacting at two points in the longitudinal direction, and thermal interaction between adjacent LED elements 22 can be reduced. Further, the LED element 22 of the glass-sealed LED 302 is just over the formation site of the radiator pattern 326 and the glass-sealed LED 302 is bonded through the solder material 337 to the metal base portion 331 without the insulating layer 333 with a high heat resistance, so that heat generated from the LED element 22 can be directly conducted through the radiator pattern 326 to the metal base portion 331. Then, heat conducted to the metal base portion 331 is conducted to the radiator plate 306. Here, both of the metal base portion 331 and the radiator plate 306 are formed of copper with relatively high heat conductivity and bonded each other by a metal material, so that heat can be smoothly conducted therebetween. Heat conducted to the radiator plate 306 is then radiated in the air from the surface of the radiator plate 306.

Figure 17:
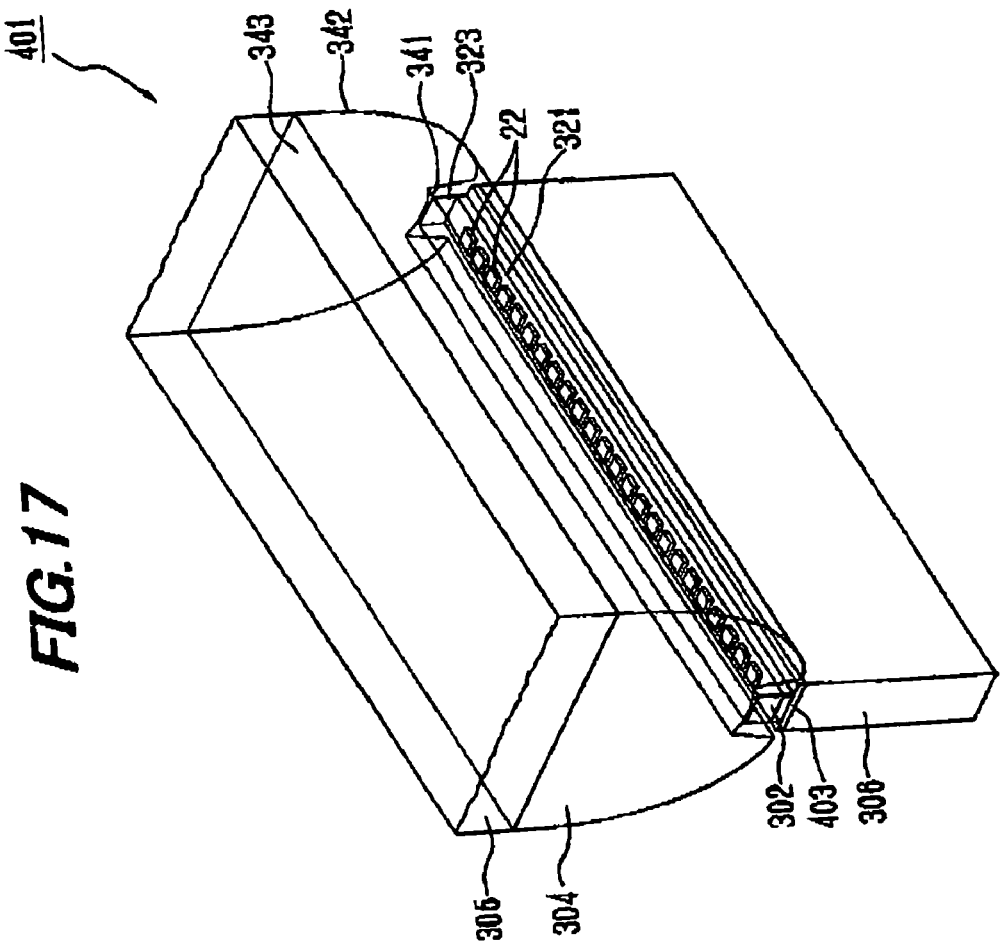
FIG. 17 is a schematic perspective view showing a light source unit in a modification.
Figure 18:
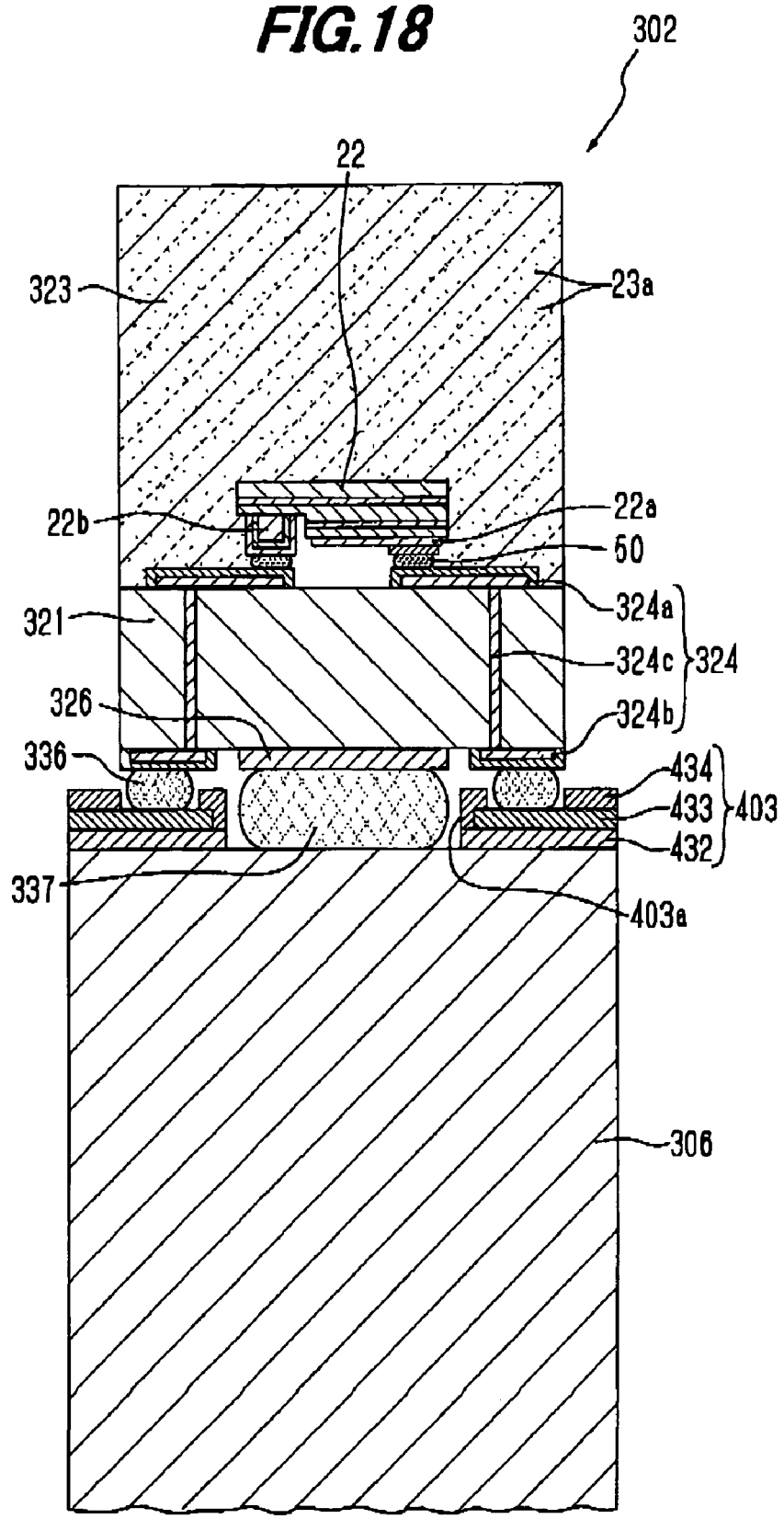
FIG. 18 is a schematic vertical cross sectional view showing a light source unit in another modification.

In the second embodiment, the metal base portion 331 of the mounting board 303 is formed of copper. The metal base portion 331 may be formed of aluminum etc. In further modification, as shown in FIG. 17, a mounting board 403 may include a resin thinner than the metal base board. As shown in FIG. 17, a light source unit 401 is composed such that the mounting board 403 is formed of a flexible board with a base material such as polyamide or liquid crystal polymer and disposed between the glass-sealed LED 302 and the radiator plate 306. As shown in FIG. 18, the mounting board 403 is composed of, formed in the following order from the bottom side, a first polyamide layer 432, a circuit pattern layer 433 and a second polyamide layer 434. When the relatively thin film board is thus used as the mounting board 403, a hole 403a is preferably for heat radiation formed at a position corresponding to the radiator pattern 326 of the glass-sealed LED 302 such that the radiator pattern 326 of the glass-sealed LED 302 is directly bonded to the radiator plate 306 by the solder material 337. In other words, as shown in FIG. 18, the radiation pattern 326 is disposed just under solder bumps 50 for bonding the electrodes thereof to the circuit pattern 324a, so that the thermal resistance between the LED element 22 and the radiator plate 306 can be lowered.

Figure 19:
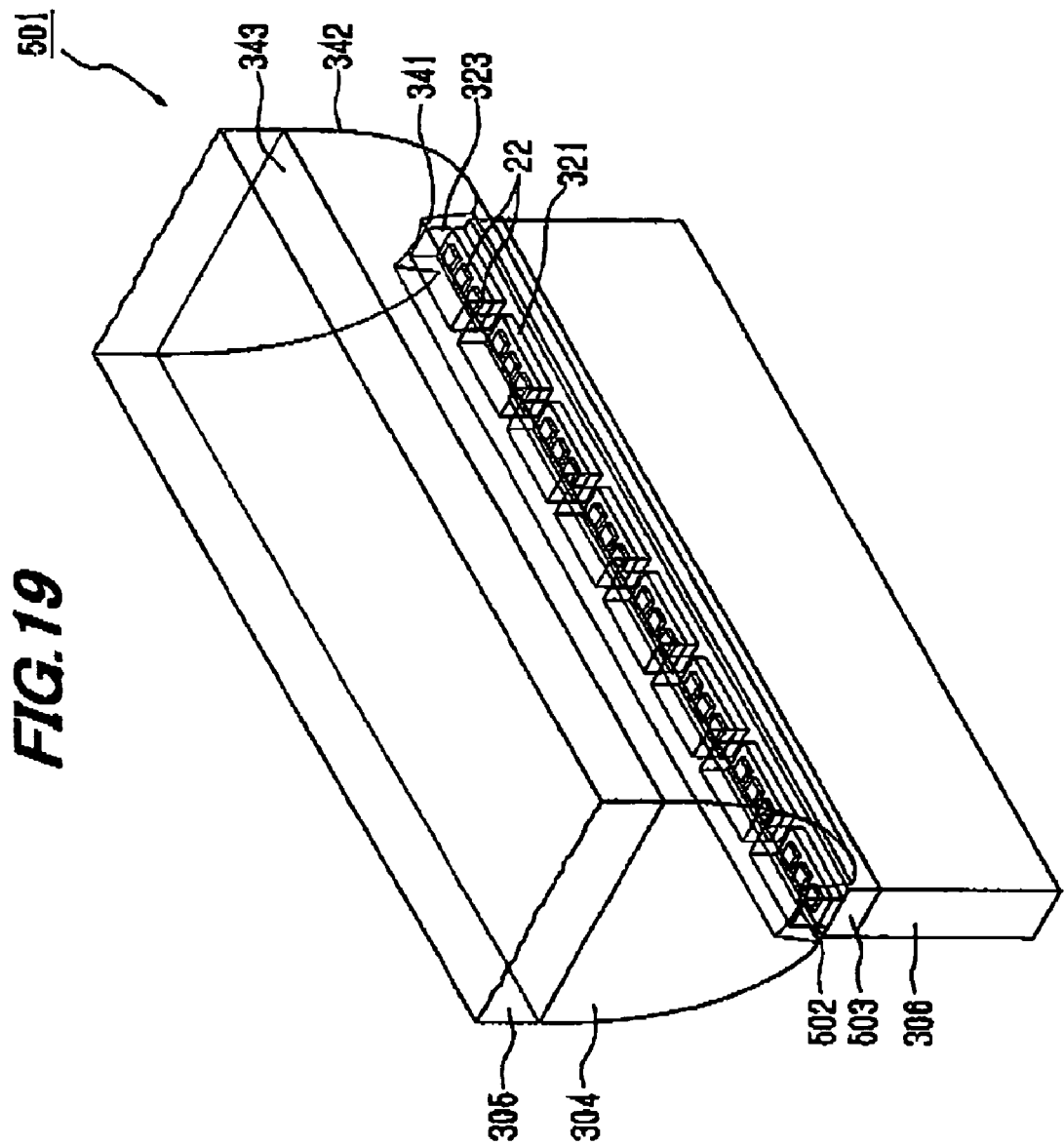
FIG. 19 is a schematic perspective view showing a light source unit in another modification.

Although in the second embodiment the twenty-four LED elements 22 are glass-sealed together, the number of LED elements 22 together glass-sealed is arbitrary. For example, as shown in FIG. 19, eight glass-sealed LEDs 502 each of which has three LED elements 22 glass-sealed in the depth direction may be arranged in the depth direction on a mounting board 503.

Third Embodiment

Figure 20:
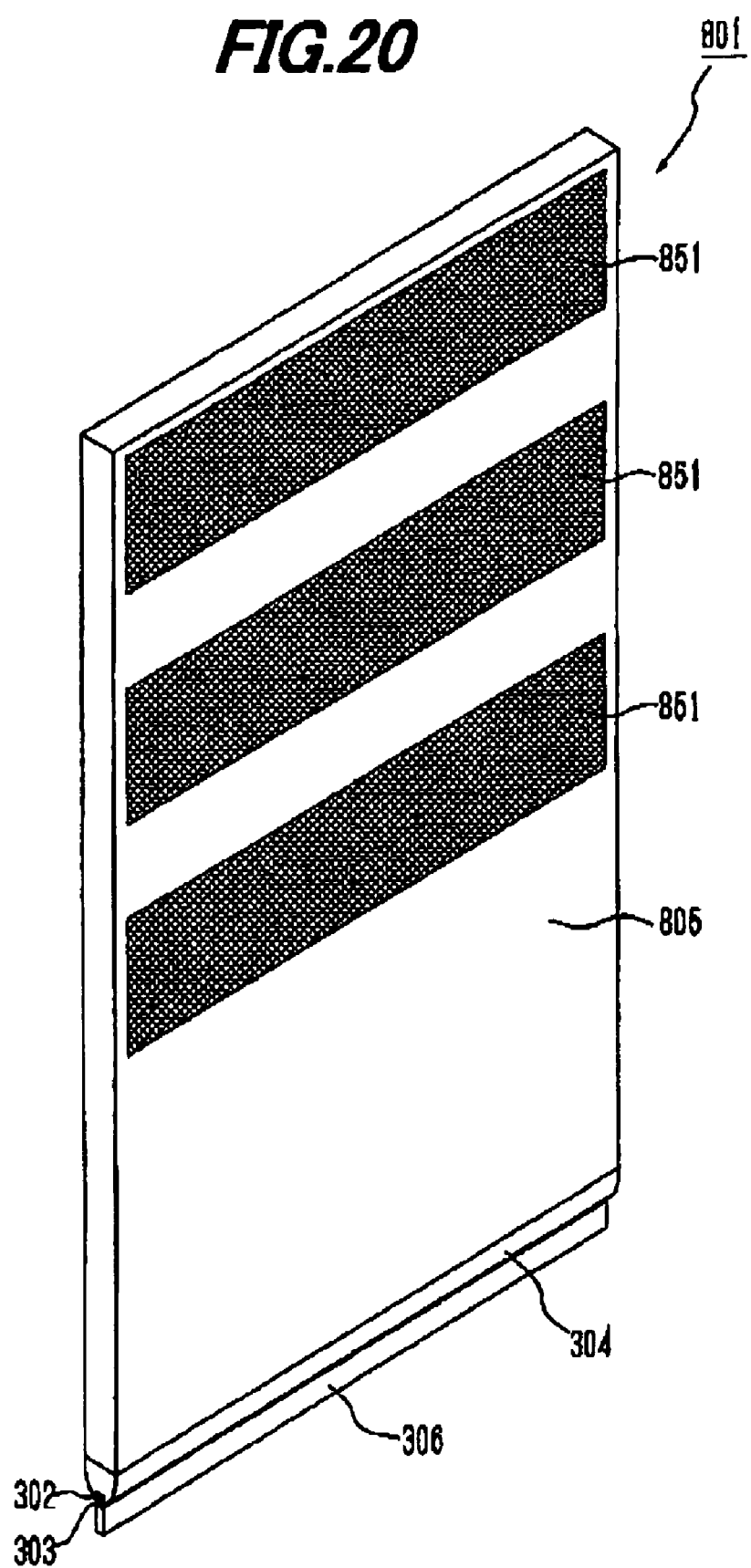
FIG. 20 is a schematic perspective view showing a light source unit in a third preferred embodiment according to the invention.

FIG. 20 is a schematic perspective view showing a light source unit in the third preferred embodiment according to the invention.

As shown in FIG. 20, the light source unit 801 is composed of a mounting board 303 on which a glass-sealed LED 302 is mounted, an optical connection member 304 into which light emitted from the glass-sealed LED 302 is inputted, a light guiding member 805 into which light outputted from the optical connection member 304 is then inputted, and a radiator plate 306 which is attached to the bottom of the mounting board 303 and extends down from the mounting board 303. The light source unit 801 has the same composition as the light source unit 301 of the second embodiment except being elongate in the depth direction and having the light guiding member 805.

The light guiding member 805 is formed a flat plate and constructed such that light outputted from the glass-sealed LED 302 side is multiply reflected inside the light guiding member 805. For example, the light guiding member 805 is 3.0 mm in thickness (i.e., a dimension in the width direction), 500 mm in height (i.e., a dimension in the vertical direction), and 300 mm in width (i.e., a dimension in the depth direction). The light guiding member 805 is provided with a roughened portion 851 as a light scattering portion formed on one surface thereof. In this embodiment, the three roughened portions 851 are formed opposite the glass-sealed LED 302 and arranged in the height direction.

According to the light source unit 801 thus composed, since the roughened portions 851 are formed on one surface of the light guiding member 805 for scattering light, light can be scattered at the roughened portions 851 to render the chromaticity of light more uniform in the light guiding member 805.

Although in the third embodiment the roughened portions 851 are formed opposite the glass-sealed LED 302 on one surface of the light guiding member 805, the roughened portion 851 may be formed on both surfaces of the light guiding member 805. Although the roughened portions 851 are formed opposite the glass-sealed LED 302 in the light guiding member 805, the roughened portion 851 may be formed at an arbitrary site, e.g., along the longitudinal direction (or height direction) of the light guiding member 805.

Figure 21:
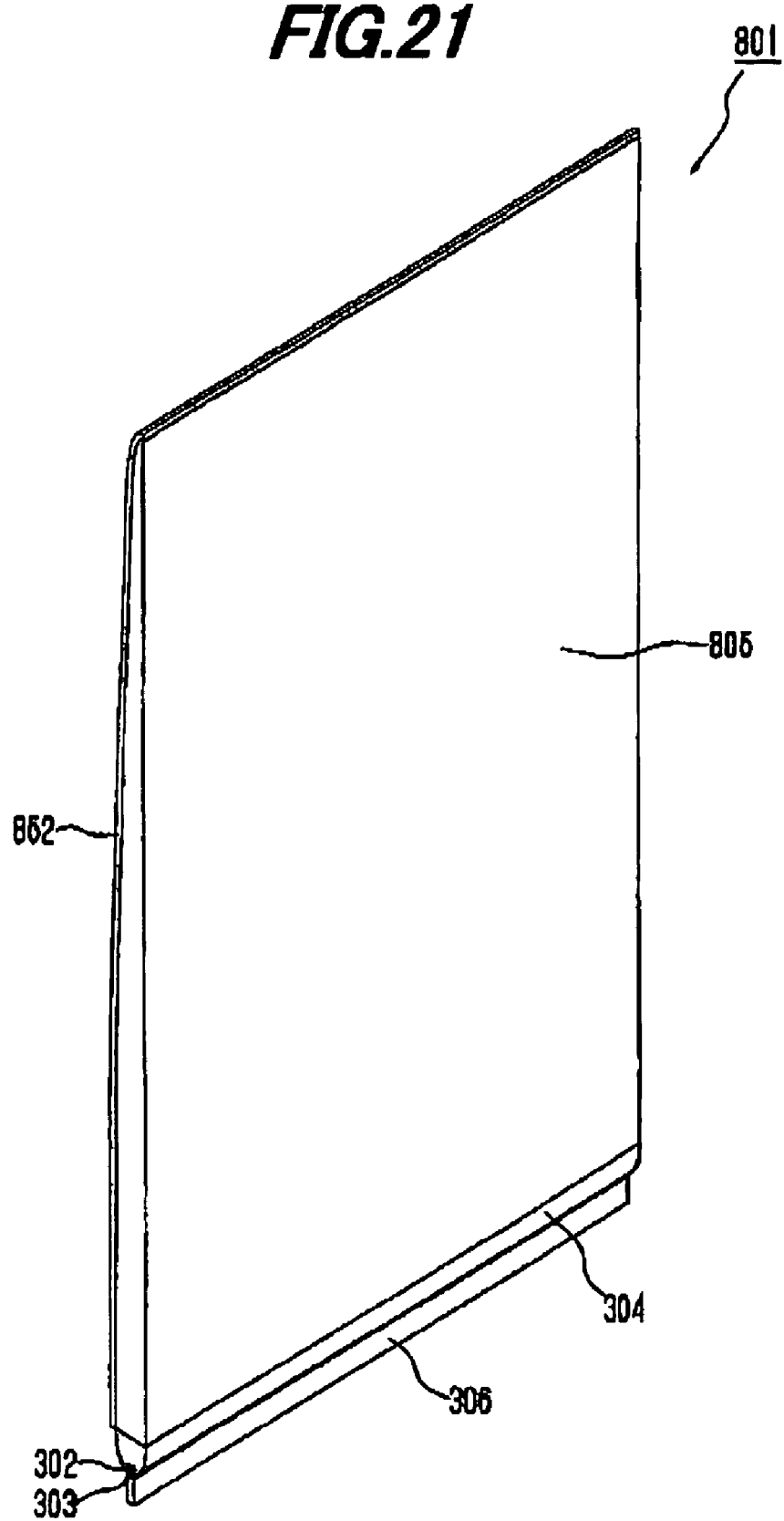
FIG. 21 is a schematic perspective view showing a light source unit in a modification.

As shown in FIG. 21, instead of the roughened portion 851, a light scattering sheet 852 may be formed on the surface of light guiding member 805 for scattering light. The light source unit 801 in FIG. 21 has the light guiding member 805 that is formed continuously reduced in thickness toward the top thereof and one surface thereof is inclined to the other surface thereof in the height direction. The light scattering sheet 852 is formed of, e.g., a white fluorine resin, preferably stretched polytetafluoroethylene.

Fourth Embodiment

Figure 22:
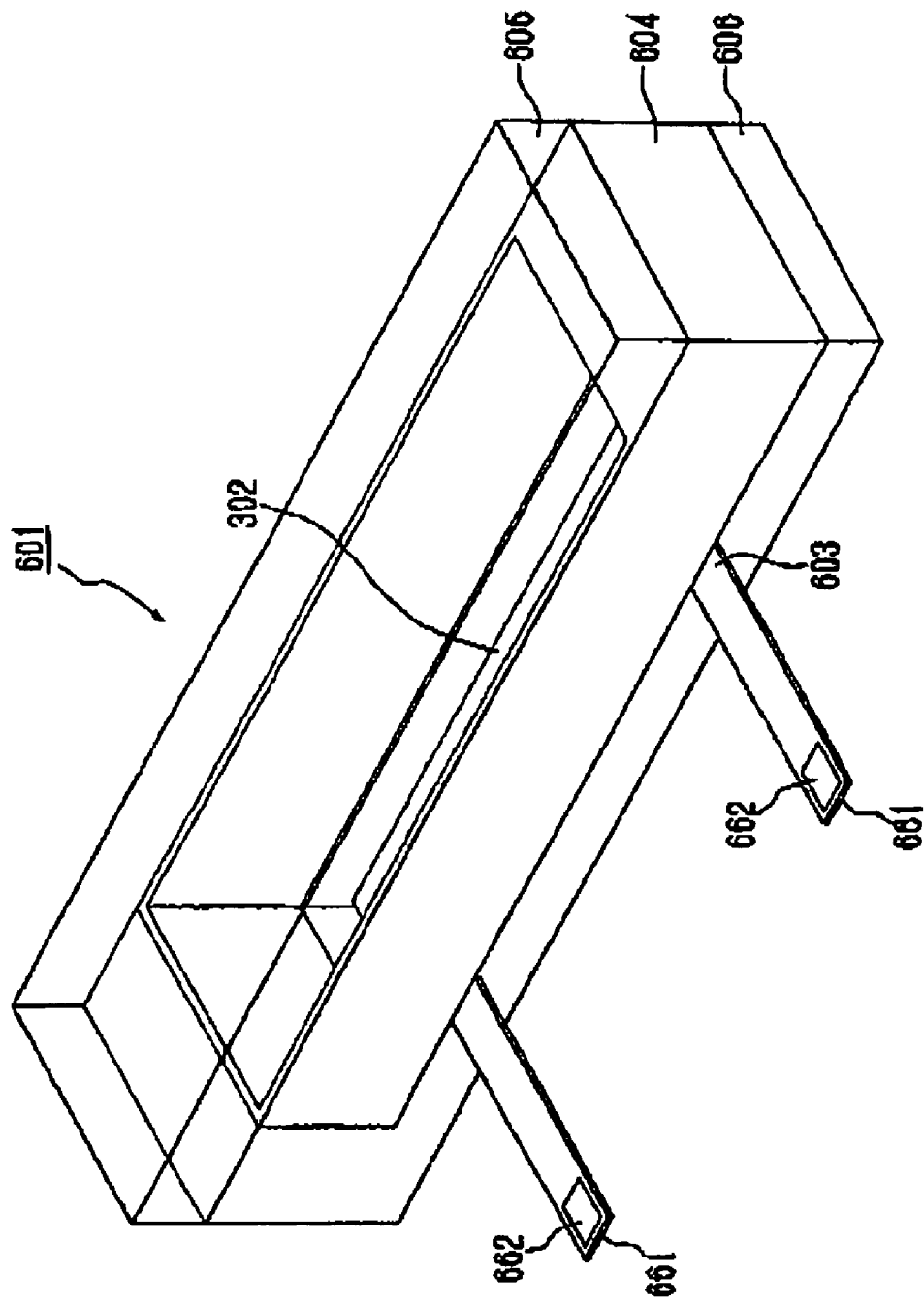
FIG. 22 is a schematic perspective view showing a light source unit in a fourth preferred embodiment according to the invention.
Figure 23:
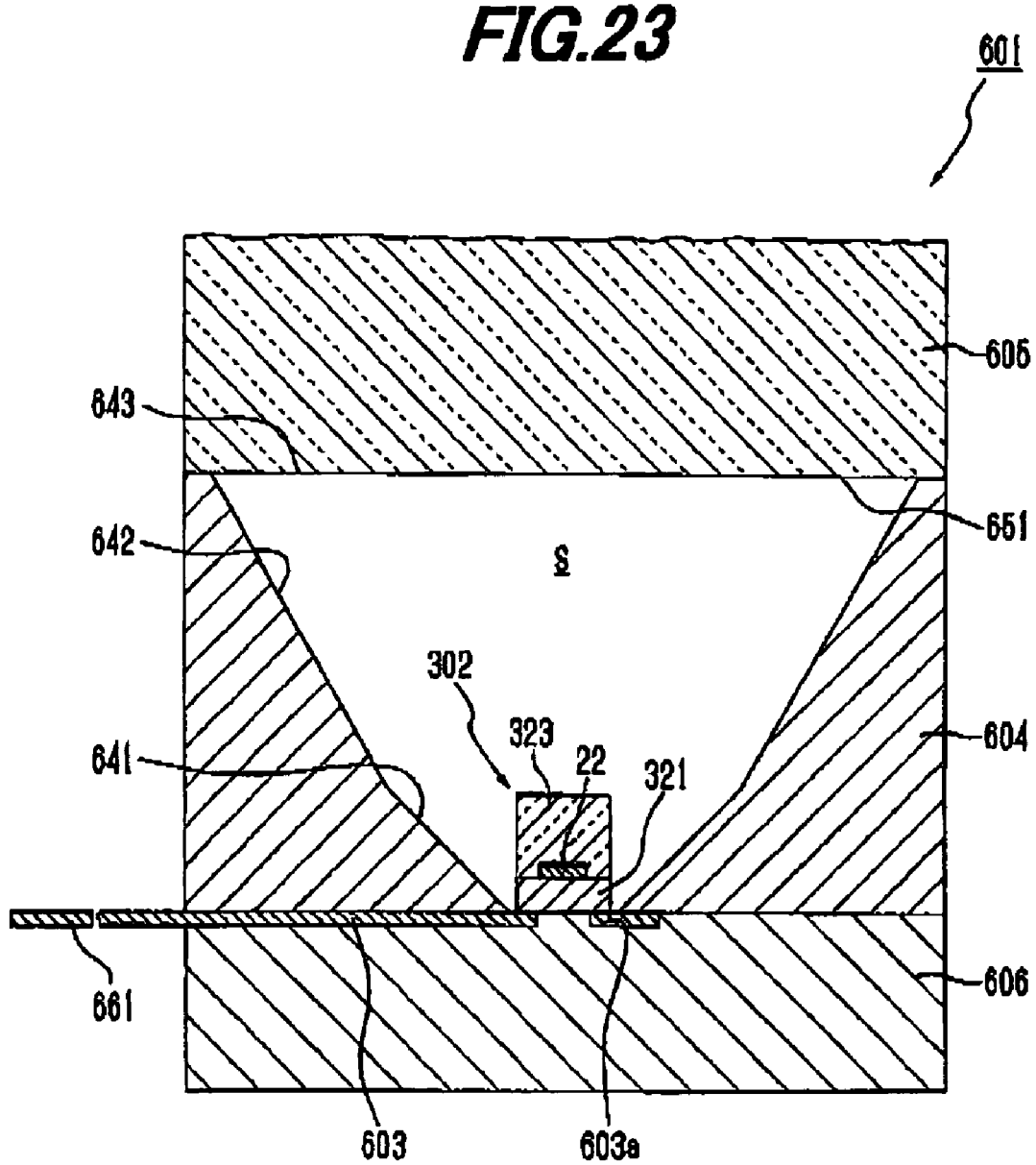
FIG. 23 is a schematic vertical cross sectional view showing the light source unit in FIG. 22.
Figure 24:
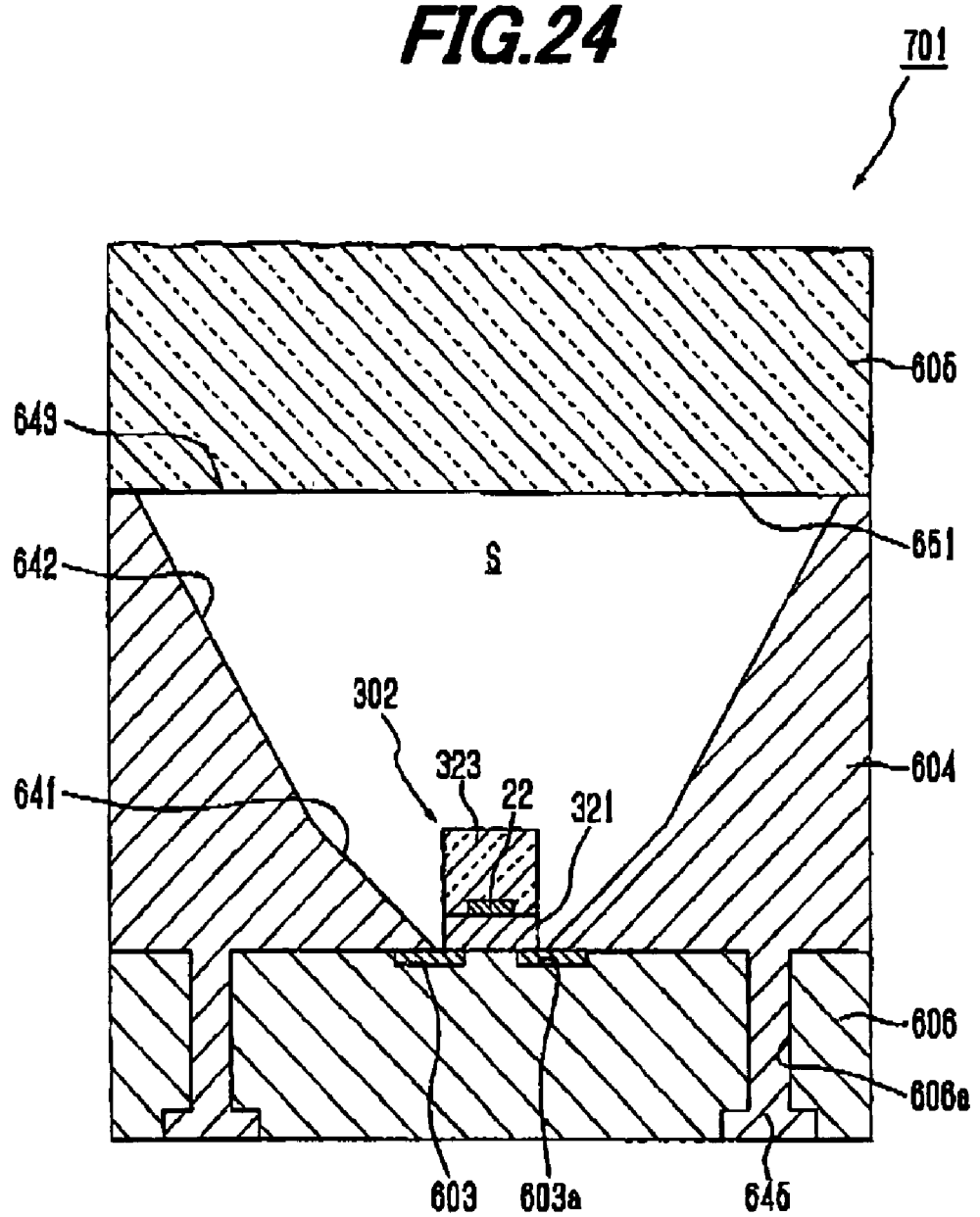
FIG. 24 is a schematic vertical cross sectional view showing a light source unit in a modification.

FIGS. 22 and 23 show the fourth preferred embodiment of the invention. FIG. 22 is a schematic perspective view showing a light source unit in the fourth preferred embodiment according to the invention.

As shown in FIG. 22, the light source unit 601 is composed of a glass-sealed LED 302, a mounting board 603 on which the glass-sealed LED 302 is mounted, an optical connection member 604 to which light emitted from the glass-sealed LED 302 is inputted, and a light guiding member 605 into which light outputted from the optical connection member 604 is then inputted. The light source unit 601 is constructed such that, when the glass-sealed LED 302 emits light, the transparent and plate light guiding member 605 radiates light from its entire body. The glass-sealed LED 302 has the same composition as the light source unit 301 in the second embodiment. In this embodiment, the optical connection member 604 is a reflection mirror of aluminum, and attached to a metal block 606 of copper at the bottom side thereof. The light source unit 601 is formed a rectangular solid which is composed of the optical connection member 604 and the metal block 606, and the glass-sealed LED 302 is disposed inside the optical connection member 604.

The mounting board 603 is formed of a flexible board with a base material such as polyamide or liquid crystal polymer and disposed between the glass-sealed LED 302 and the metal block 606. In this embodiment, the mounting board 603 is sandwiched between the optical connection member 604 and the metal block 606, and provided with a pair of extension portions 661 extending externally from the optical connection member 604 and the metal block 606. An electrode 662 is formed at the end of each of the extension portions 661.

FIG. 23 is a schematic vertical cross sectional view showing the light source unit in FIG. 22. As shown in FIG. 23, a concave portion 603a is formed on the top surface of the metal block 606 for receiving the mounting board 603. The metal block 606 is bonded to the optical connection member 604 by a solder material (not shown).

The optical connection member 604 is provided with a first reflection surface 641 at the lower side, and a second reflection surface 642 formed continuously from the top end of the first reflection surface 641. The first reflection surface 641 and the second reflection surface 642 are to reflect light emitted from the side face of the glass seal portion 323 of the glass-sealed LED 302 toward the incidence surface 651 of light guiding member 605. The first reflection surface 641 has an inclination angle to the optical axis of the glass-sealed LED 302 greater than the second reflection surface 642. The first reflection surface 641 is 45 degrees in angle defined relative to the top surface of the metal block 606, and the second reflection surface 642 is 60 degrees in angle defined relative to the top surface of the metal block 606. The first reflection surface 641 has the same height as the glass-sealed LED 302 so as to prevent light emitted from the top face of the glass seal portion 323 from being inputted thereinto.

The light guiding member 605 is of transparent resin such as acrylic resin, and shaped to be coincident with the metal block 606 and the optical connection member 604 in top view. The incidence surface 651 of the light guiding member 605 is parallel to the top face of the glass seal portion 323. A cavity 'S' is defined by the metal block 606, the optical connection member 604, and the light guiding member 605.

According to the light source unit 601 thus constructed, mixed light of blue light and yellow light is emitted from the glass-sealed LED 302 when a voltage is applied through the mounting board 603 to the glass-sealed LED 302. Here, most of light emitted from the LED element 22 can be refracted at the surface of the glass seal portion 323 since the glass seal portion 323 is formed a rectangular solid.

Light inputted to the optical connection member 604 from the glass-sealed LED 302 is reflected on the first reflection surface 641 and the second reflection surface 642, and inputted into the light guiding member 605, so that the light guiding member 605 emits light from its entire body. Meanwhile, since most of light emitted from the glass-sealed LED 302 is refracted at the surface of the glass seal portion 323, most of light components inputted to the light guiding member 605 are not perpendicular to the incidence surface 651 of the light guiding member 605. In other words, most of light components inputted to the light guiding member 605 are not parallel to each other.

Since in the glass-sealed LED 302 the second distance 'b' is smaller than the first distance 'a', the amount of light outputted from the glass-sealed LED 302 can be significantly increased to enhance the brightness of the light guiding member 605. Since light inputted to the light guiding member 605 is obtained by superposing the mirrored light source on the real light source, the light distribution characteristic of light outputted from the side face of the glass seal portion 323 is superposed on the light distribution characteristic of light outputted from the top surface of the glass seal portion 323, so that both lights can be well mixed. Further, since light inputted through the incidence surface 651 into the light guiding member 605 is multiply reflected inside the light guiding member 605, the mixing of both lights can be promoted. Thus, at the emission surface of the light guiding member 605, surface emission or luminescence with uniform chromaticity and brightness can be realized without causing unevenness in chromaticity and brightness.

According to the light source unit 601 of this embodiment, since the second distance 'b' is smaller than the first distance 'a', the light source unit 601 can be downsized in the width direction thereof. In particular, since the light guiding member 605 uses the flat plate shape extending in the direction perpendicular to the mounting board 603, it can be narrowed in the width direction to downsize the unit and this is very advantageous in practical use.

The reflection surface of the optical connection member 604 may be arbitrarily formed if the reflection surface is higher than the glass-sealed LED 302 and formed such that light emitted from the side face of the glass seal portion 323 can be reflected in the range of being radiated directly to the light guiding member 605 from the top face of the glass seal portion 323. For example, instead of forming the two-step reflection surface as in the fourth embodiment, the single reflection surface may be formed to have 45 degrees to the top surface of the metal block 606. The reflection surface is desirably formed to reflect light toward the center axis of the glass-sealed LED 302. When light inputted to the light guiding member 605 is reflected toward the center axis of the glass-sealed LED 302, the number of reflections inside the light guiding member 605 decreases. Thus, the glass-sealed LED 302 and the optical connection member 604 are desirably constructed such that the light distribution characteristics of blue light emitted from the top face and yellow light emitted from the side face are substantially consistent with each other before being inputted into the light guiding member 605.

Although in the fourth embodiment the metal block 606 is bonded to the optical connection member 604 by the solder, a fixing portion 645 inserted into a throughhole 606a in the metal block 606 may be provided to secure both of them. Instead, both of them may be secured by using a screw.

Fifth Embodiment

Figure 25:
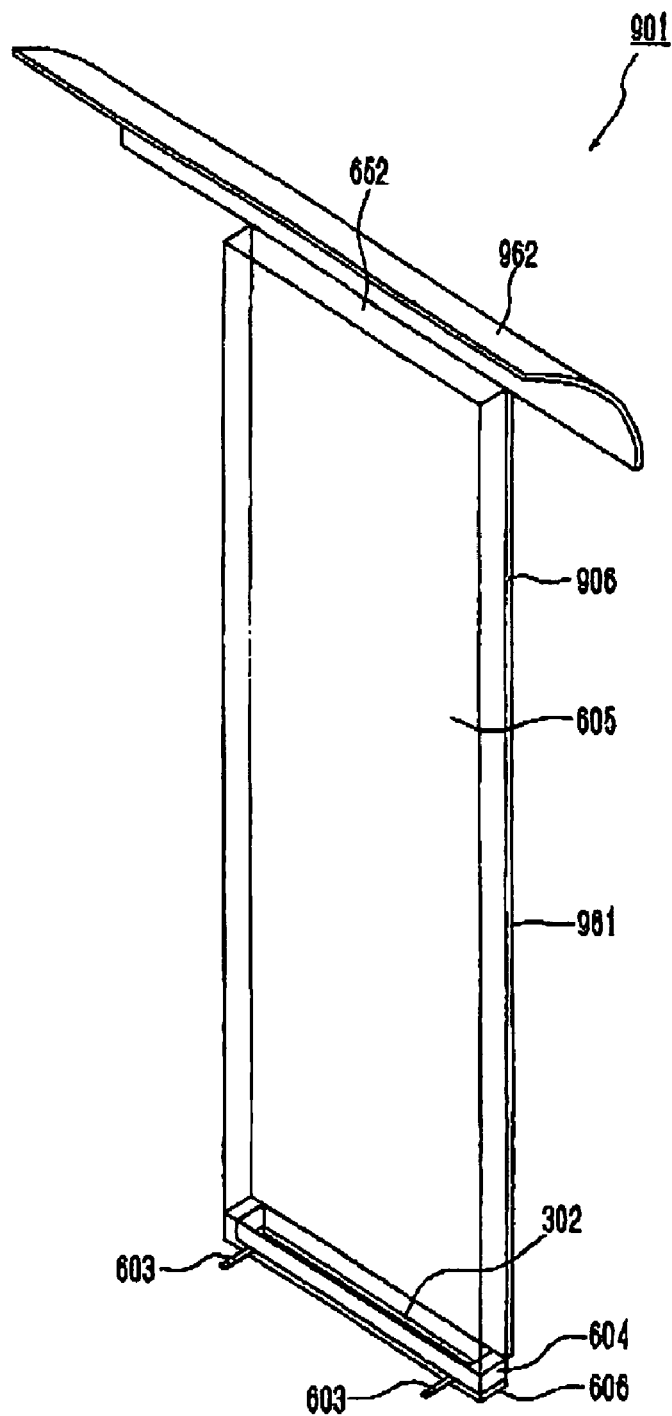
FIG. 25 is a schematic perspective view showing a light source unit in a fifth preferred embodiment according to the invention.

FIG. 25 is a schematic perspective view showing a light source unit in the fifth preferred embodiment according to the invention.

As shown in FIG. 25, as in the light source unit 601 although slightly different in dimensions, the light source unit 901 is composed of a glass-sealed LED 302, a mounting board 603 on which the glass-sealed LED 302 is mounted, an optical connection member 604 into which light emitted from the glass-sealed LED 302 is inputted, a light guiding member 605 into which light outputted from the optical connection member 604 is then inputted, and a metal block 606 bonded to the optical connection member 604. The light guiding member 605 of the light source unit 901 is formed a flat plate and has a radiation surface 652 at one end thereof opposite the glass-sealed LED 302. The light source unit 901 is provided with a guide member 906 for guiding light radiated from the radiation surface 652 of the light guiding member 605.

The guide member 906 is composed of a covering portion 961 that is formed of a plate steel material with white coating on the surface, and connected to one surface of the light guiding member 605, and a guide portion 962 formed continuously with the covering portion 961 and disposed at a predetermined distance from the radiation surface 652. The covering portion 961 is formed flat along the light guiding member 605 and disposed via an air layer along the light guiding member 605. The guide portion 962 is formed curved to cover the radiation surface 652 of the light guiding member 605 from the top end of the covering portion 961. In this embodiment, the guide portion 962 is formed an arc with a predetermined curvature in cross section and disposed opposite the radiation surface 652. The guide portion 962 is formed wider than the light guiding member 605 so as to guide light radiated from the radiation surface without leakage. For example, the light guiding member 605 is formed a flat plate which is 5.0 mm in thickness (i.e., a dimension in the width direction), 1500 mm in height (i.e., a dimension in the vertical direction), and 50 mm in width (i.e., a dimension in the depth direction). The guide portion 962 is 100 mm in width (i.e., a dimension in the depth direction).

The material of the guide member 906 is arbitrary and may be, e.g., aluminum. In this case, without forming a white coating on the surface, light radiated from the radiation surface 652 can be sufficiently reflected. The rolling tracks of aluminum may be placed in the vertical direction such that light radiated from the radiation surface 652 can be in the depth direction by using the rolling tracks.

Figure 26:
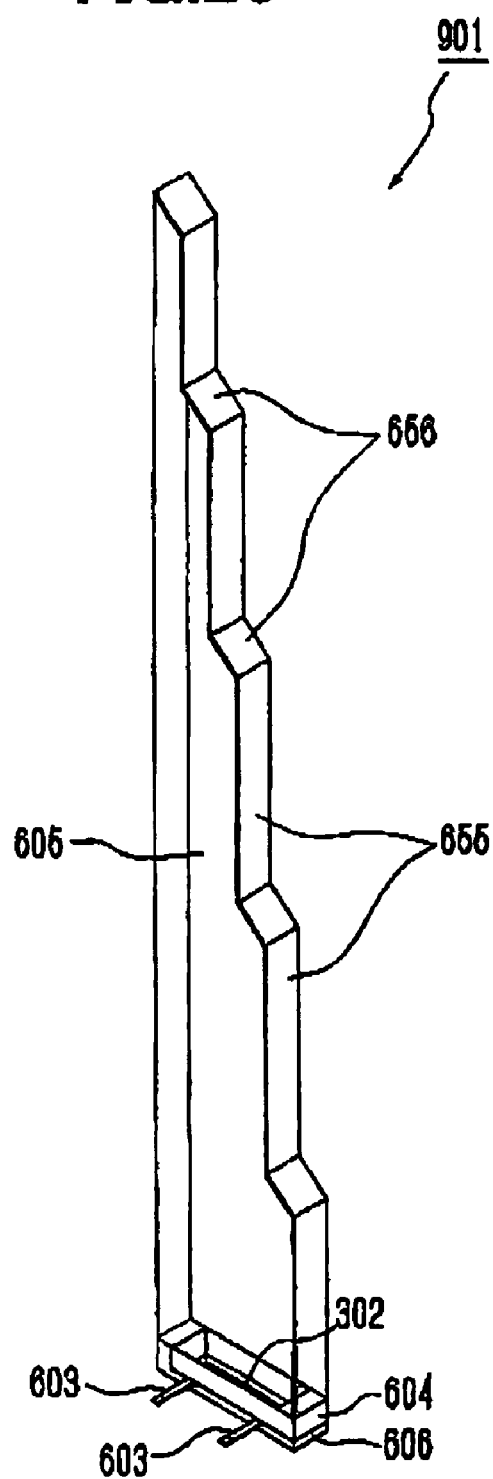
FIG. 26 is a schematic perspective view showing a light source unit in a modification.
Figure 27:
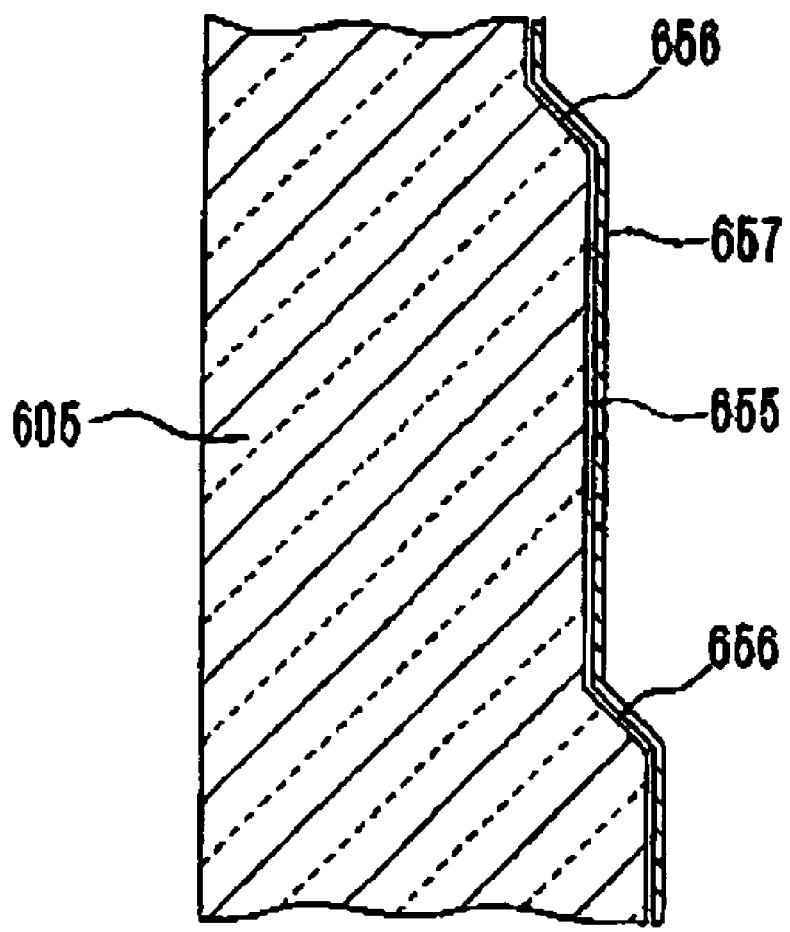
FIG. 27 is a schematic enlarged vertical cross sectional view showing a part of a light guiding member in another modification.

In modification, as shown in FIG. 26, at one end face of the light guiding member 605 in the width direction, parallel planes 655 extending in the longitudinal direction and slant planes 656 inclined toward the top end in the longitudinal direction may be formed alternately such that light inputted to the slant planes 656 can be reflected toward the other end face side in the width direction. In the light source unit 901 as shown in FIG. 26, the parallel planes 655 and the slant planes 656 have a white coating formed thereon. In this case, light can be reflected and scattered by the parallel planes 655 and the slant planes 656, so that uniform white light can be obtained without considering the light distribution characteristics of blue light (from the top face) and yellow light (from the side face) emitted from the glass-sealed LED 302. However, as shown in FIG. 27, when the parallel planes 655 and the slant planes 656 are mirror-finished and contact the air layer, light is subjected to total reflection on the parallel planes 655 and the slant planes 656. Therefore, in consideration of unevenness in emission color at the radiation surface, it is preferable that the light distribution characteristics of blue light (from the top face) and yellow light (from the side face) emitted from the glass-sealed LED 302 are approximated each other. In FIG. 27, parallel planes 655 and the slant planes 656 are covered with a white sheet 657 via the air layer.

Sixth Embodiment

Figure 28:
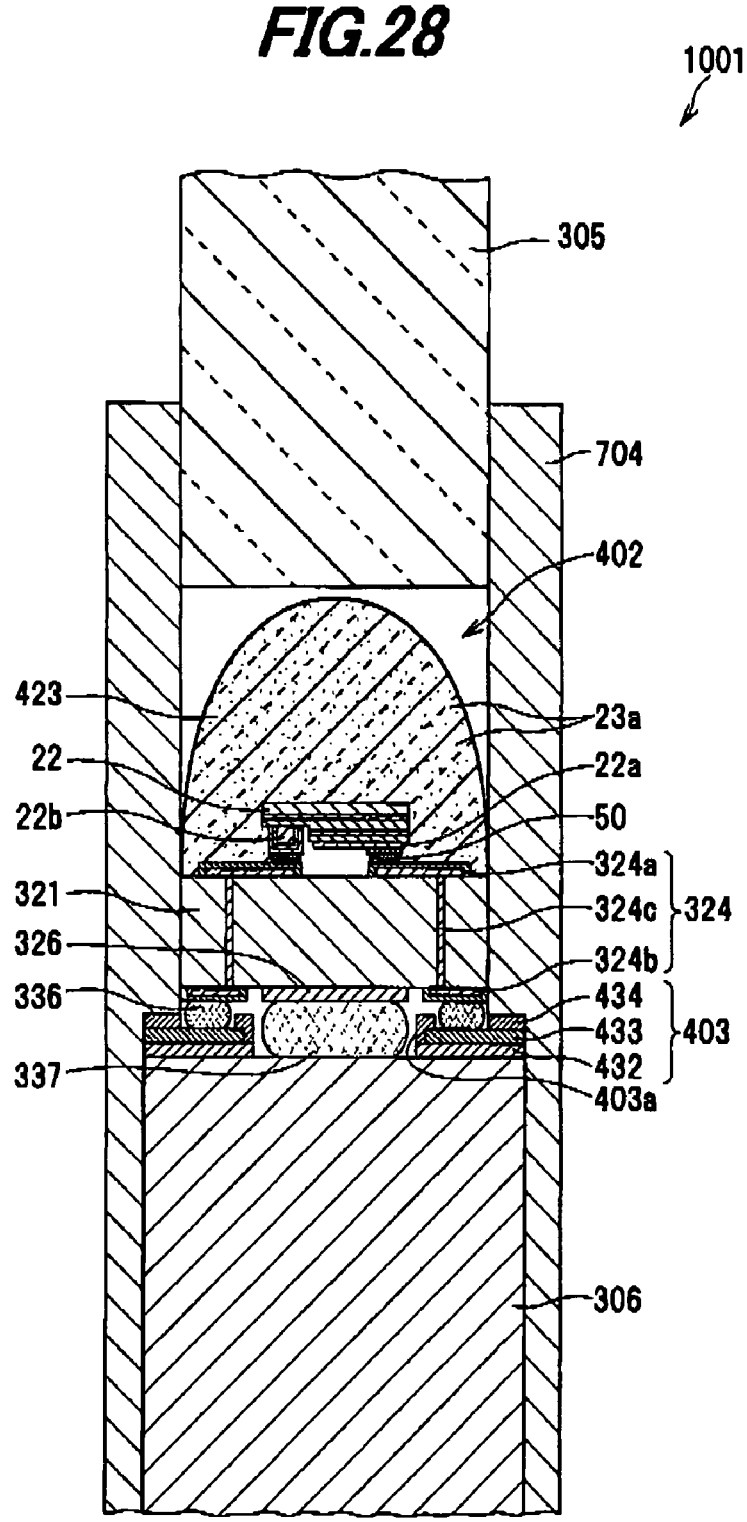
FIG. 28 is a schematic perspective view showing a light source unit in a sixth preferred embodiment according to the invention.

FIG. 28 is a schematic perspective view showing a light source unit in a sixth preferred embodiment according to the invention.

As shown in FIG. 28, the light source unit 1001 of the sixth embodiment is different from the light source unit 301 of the second embodiment in that it includes a glass-sealed LED 402 with a dome-shaped glass seal portion 423 and an optical connection member 704 as a straight-type reflection mirror. The other components in FIG. 28 are substantially the same as in FIG. 18 and therefore the explanation thereof will be in principle omitted below.

The light source unit 1001 is composed of the glass-sealed LED 402, a mounting board 403 on which the glass-sealed LED 402 is mounted, an optical connection member 704 to which light emitted from the glass-sealed LED 402 is inputted, and a light guiding member 305 into which light outputted from the optical connection member 704 is then inputted. The light source unit 1001 is constructed such that, when the glass-sealed LED 402 emits light, the transparent and plate light guiding member 305 radiates light from its entire body.

In this embodiment, the optical connection member 704 is a reflection mirror of aluminum, which is attached on both sides of the glass-sealed LED 402, the mounting board 403 and the radiator plate 306 of copper (or aluminum) such that it is formed along the shape of the glass-sealed LED 402, the mounting board 403 and the radiator plate 306. The optical connection member 704 as a straight-type (or plate-type) reflection mirror serves to reflecting light emitted laterally from the glass-sealed LED 402 toward the light guiding member 305. Due to the straight-type design, the light source unit 1001 can be downsized in width.

The glass-sealed LED 402 has substantially the same composition as the glass-sealed LED 302 of the light source unit 301 in the second embodiment except the dome-shaped glass seal portion 423. The glass-sealed LED 402 includes the dome-shaped glass seal portion 423 with a phosphor 23a dispersed therein. Due to using the dome-shaped glass seal portion 423 with a high focusing property, light emitted laterally from the glass-sealed LED 402 can be sufficiently inputted into the light guiding member 305 even when the relatively thin light guiding member 305 is used in combination with the straight-type reflection mirror.

In the sixth embodiment, as shown in FIG. 16, the ceramic board 321 is provided with the top surface pattern 324a for electrically connecting in series the plural LED elements 22. In this embodiment, the top surface pattern 324a is connected to the via patterns 324c at both ends of the ceramic board 321 in the longitudinal direction. The top surface pattern 324a is connected to the p-side electrode 22a of a specific LED element 22 at its one end in the width direction of the ceramic board 321, and to the n-side electrode 22b of an LED element 22 next to the specific LED element 22 at its other end in the width direction of the ceramic board 321. Thus, the top surface pattern 324a is formed inclined in the width direction to the longitudinal direction of the ceramic board 321 between LED elements 22.

In the sixth embodiment, the radiator plate 306 is formed of copper. The radiator plate 306 may be formed of aluminum etc. The mounting board 403 is formed of a flexible board with a base material such as polyamide or liquid crystal polymer and disposed between the glass-sealed LED 402 and the radiator plate 306. As shown in FIG. 28, the mounting board 403 is composed of; formed in the following order from the bottom side, a first polyamide layer 432, a circuit pattern layer 433 and a second polyamide layer 434. Further, the mounting board 403 is provided with a hole 403a for heat radiation which is formed at a position corresponding to the radiator pattern 326 of the glass-sealed LED 402 such that the radiator pattern 326 of the glass-sealed LED 402 is directly bonded to the radiator plate 306 by the solder material 337. In other words, as shown in FIG. 28, the radiation pattern 326 is disposed just under solder bumps 50 for bonding the electrodes thereof to the circuit pattern 324a, so that the thermal resistance between the LED element 22 and the radiator plate 306 can be lowered.

Heat generated from the LED elements 22 of the glass-sealed LED 402 is conducted through the ceramic board 321, the radiator pattern 326 and the solder material 337 to the radiator plate 306. Here, the p-side electrode 22a and the n-side electrode 22b of the LED element 22 are arranged in the width direction (i.e., in the direction perpendicular to the arranging direction of the LED element 22) such that the LED element 22 contacts the ceramic board 321 at the two points in the width direction, so that heat can be more efficiently conducted from the LED element 22 to the ceramic board 321 than the case of contacting at two points in the longitudinal direction, and thermal interaction between adjacent LED elements 22 can be reduced. Further, the LED element 22 of the glass-sealed LED 402 is just over the formation site of the radiator pattern 326 and the glass-sealed LED 402 is bonded through the solder material 337 to the radiator plate 306 without the mounting board 403 with a high heat resistance, so that heat generated from the LED element 22 can be directly conducted through the radiator pattern 326 to the radiator plate 306. Then, heat conducted to the metal base portion 331 is conducted to the radiator plate 306. Here, the radiator plate 306 is formed of copper with relatively high heat conductivity and bonded each other by a metal material, so that heat can be smoothly conducted therebetween. Heat conducted to the radiator plate 306 is then radiated in the air from the surface of the radiator plate 306.

Modifications

Figure 29A:
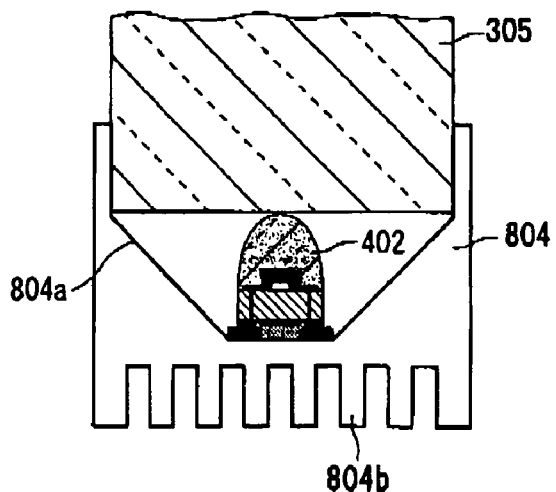
FIGS. 29A to 29C are schematic vertical cross sectional views showing modifications in the sixth embodiment.
Figure 29B:
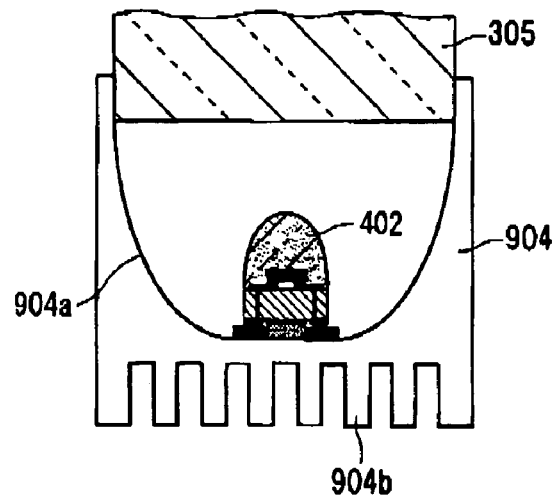
Figure 29C:
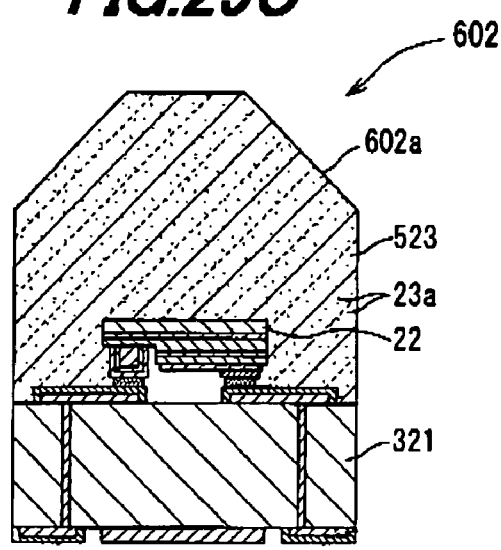

FIGS. 29A to 29C are schematic vertical cross sectional views showing modifications in the sixth embodiment.

As shown in FIG. 29A, instead of the optical connection member 704 and the radiator plate 306, a reflection mirror 804 may be used which serves both as a reflection mirror and as a radiator plate. In other words, the reflection mirror 804 is an integrated body of the optical connection member 704 and the radiator plate 306. The reflection mirror 804 includes a tapered reflection surface 804a with an inclination of 45 degrees formed inside thereof, and the tapered reflection surface 804a extends to the same height as the glass-sealed LED 402. The reflection mirror 804 may include radiation fins 804b for increasing the heat radiation area.

Alternatively, as shown in FIG. 29B, a reflection mirror 904 may be used which serves both as a reflection mirror and as a radiator plate. The reflection mirror 904 includes a nearly paraboloidal reflection surface 904a formed inside thereof, and the paraboloidal reflection surface 904a has a curvature decreased according as being close to the light guiding member 305. The reflection mirror 904 may include radiation fins 904b for increasing the heat radiation area.

On the other hand, as shown in FIG. 29C, a glass-sealed LED 602 may be used instead of the glass-sealed LED 402. The glass-sealed LED 602 has a glass seal portion 523 with a cutting faces 602a formed by cutting off the top corners of the glass seal portion 323 as shown in FIG. 18. The glass-sealed LED 602 includes the glass seal portion 523 with a phosphor 23a dispersed therein. Due to using the glass seal portion 523 with a high focusing property, light emitted laterally from the glass-sealed LED 602 can be sufficiently inputted into the light guiding member 305 even when the relatively thin light guiding member 305 is used in combination with the straight-type reflection mirror.

In the first to third embodiments, the explanations are made specifying the width, depth and vertical directions. However, the light source units 1, 301, 601 etc. can be used in an arbitrary posture. For example, the posture may be changed to radiate light downward or horizontally etc.

Although in the above embodiments the sealing material is of glass, it may be of resins. Furthermore, the concrete and detailed compositions or structures described herein can be changed arbitrarily.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light source unit, comprising:
   a light source portion, comprising:
      a mounting board;
      a light emitting element mounted on the mounting board;
      a rectangular solid sealing material for sealing the light emitting element, the sealing material comprising a first distance between the light emitting element and a top face thereof and a second distance between the light emitting element and a side face thereof, the first distance being greater than the second distance; and
      a phosphor dispersed in the sealing material for radiating a wavelength conversion light by being excited by light emitted from the light emitting element,
      wherein a first light emitted through the top face of the sealing material is different in emission color from a second light emitted through the side face of the sealing material;
   an optical connection member comprising a reflection surface for reflecting light emitted from the side face of the sealing material;
   a light guiding member comprising an end face through which light emitted through the top face of the sealing material and light reflected by the reflection surface of the optical connection member are inputted into the light guiding member; and
   a space formed between the sealing material and the optical connection member,
   wherein the light source portion comprises a plurality of the light emitting elements, the plurality of the light emitting element being arranged in line,
   wherein the rectangular solid sealing material has a dimension in a vertical direction longer than a dimension in a width direction,
   wherein the optical connection member comprises a pair of the reflection surface formed in the width direction, and wherein the light guiding member is plate-shaped and a thickness direction thereof corresponds to the width direction.

2. The light source unit according to claim 1, wherein the light guiding member further comprises a light scattering portion for scattering light inputted through the end face.

3. The light source unit according to claim 1, wherein the light guiding member is constructed such that light inputted through the end face is multiply reflected inside the light guiding member.

4. The light source unit according to claim 1, wherein the optical connection member further comprises a light scattering portion for scattering light inputted through the optical connection member into the light guiding member.

5. The light source unit according to claim 1, wherein a relationship: $\sqrt{2} \leq a/b$ is satisfied, where the first distance comprises a and the second distance comprises b.

6. The light source unit according to claim 5, wherein the sealing material comprises glass.

7. The light source unit according to claim 1, wherein a relationship: $2 \leq a/b$ is satisfied, where the first distance comprises a and the second distance comprises b.

8. The light source unit according to claim 1, wherein the rectangular solid sealing material comprises a thermal expansion coefficient that is about two times of a thermal expansion coefficient of the light emitting element.

9. The light source unit according to claim 1, wherein the reflection surface comprises a reflection film.

10. The light source unit according to claim 1, wherein the optical connection member comprises an incidence surface comprising a recess to receive the light emitting element and the rectangular solid sealing material, the incidence surface having a hemispheric shape to allow a light emitted from the light emitting element to be inputted perpendicularly to the optical connection member.

11. The light source unit according to claim 2, wherein the optical connection member comprises an output surface through which the first light and the second light, after inputting into the optical connection member, are outputted to the light guiding member, and
wherein the light scattering portion is formed on the output surface.

12. The light source unit according to line 11, wherein the output surface is formed so that a light outputted parallel to a center axis of the light source portion is scattered within about 15 degrees to the center axis.

13. The light source unit according to claim 1,
wherein the optical connection member comprises an incidence surface, and
wherein the incidence surface comprises a lens surface and a conical surface on an outer periphery of the lens surface.

14. The light source unit according to claim 13, wherein the incidence surface is inclined at about 10 degrees or less to an optical axis of the light emitting element.

15. The light source unit according to claim 1, wherein a scattering portion of the light guiding member comprises a roughened portion that is formed on a surface of the light guiding member.

16. The light source unit according to claim 1, wherein the optical connection member comprises a first reflection surface at a lower side, and a second reflection surface formed continuously from a top end of the first reflection surface.

17. A light source unit, comprising,
a mounting board;
a light emitting element connected to the mounting board;
a rectangular solid sealing material that seals the light emitting element, the rectangular solid sealing material comprising a first distance between the light emitting element and a top face thereof and a second distance between the light emitting element and a side face thereof, the first distance being greater than the second distance; and
a phosphor dispersed in the sealing material;
an optical connection member comprising a reflection surface; and
a light guiding member comprising an end face through which light emitted through a top surface of the sealing material and light reflected by the reflection surface are inputted into the light guidance member,
wherein a relationship: $\sqrt{2} \leq a/b$ is satisfied, where the first distance comprises a and the second distance comprises b,
wherein the light source portion comprises a plurality of the light emitting elements, the plurality of the light emitting element being arranged in line,
wherein the rectangular solid sealing material has a dimension in a vertical direction longer than a dimension in a width direction,
wherein the optical connection member comprises a pair of the reflection surface formed in the width direction, and
wherein the light guiding member is plate-shaped and a thickness direction thereof corresponds to the width direction.

18. The light source unit according to claim 17, wherein the rectangular solid sealing material comprises a thermal expansion coefficient that is about two times of a thermal expansion coefficient of the light emitting element.

19. The light source unit according to claim 17, wherein the optical connection member comprises an incidence surface comprising a recess to receive the light emitting element and the rectangular solid sealing material, the incidence surface having a hemispheric shape to allow a light emitted from the light emitting element to be inputted perpendicularly to the optical connection member.

20. The light source unit according to claim 17, wherein the phosphor is dispersed throughout the sealing material from the light emitting element to the top face and from the light emitting element to the side face.

21. The light source unit according to claim 1, wherein the mounting board comprises a radiator pattern formed on a back surface and just under the light emitting element.

* * * * *